US011474920B2

(12) United States Patent
Pozidis et al.

(10) Patent No.: US 11,474,920 B2
(45) Date of Patent: Oct. 18, 2022

(54) DYNAMIC MAPPING OF LOGICAL TO PHYSICAL MEMORY FOR INCREASED PERFORMANCE

(71) Applicant: International Business Machines Corporation, Armonk, NY (US)

(72) Inventors: Charalampos Pozidis, Thalwil (CH); Thomas Mittelholzer, Zurich (CH); Nikolaos Papandreou, Thalwil (CH); Milos Stanisavljevic, Adliswil (CH)

(73) Assignee: International Business Machines Corporation, Armonk, NY (US)

( * ) Notice: Subject to any disclaimer, the term of this patent is extended or adjusted under 35 U.S.C. 154(b) by 247 days.

(21) Appl. No.: 16/835,697

(22) Filed: Mar. 31, 2020

(65) Prior Publication Data
US 2021/0303425 A1 Sep. 30, 2021

(51) Int. Cl.
*G06F 11/20* (2006.01)
*H03M 13/15* (2006.01)

(52) U.S. Cl.
CPC ....... *G06F 11/2094* (2013.01); *H03M 13/154* (2013.01); *G06F 2201/82* (2013.01)

(58) Field of Classification Search
CPC ............ G06F 11/2094; G06F 2201/82; H03M 13/154
USPC .................................................. 714/6.24, 6.3
See application file for complete search history.

(56) References Cited

U.S. PATENT DOCUMENTS

| | | | |
|---|---|---|---|
| 5,942,005 A | 8/1999 | Hassner et al. | |
| 5,946,328 A | 8/1999 | Cox et al. | |
| 7,231,578 B2 | 6/2007 | Hassner et al. | |
| 8,166,370 B1 | 4/2012 | Tang et al. | |
| 10,417,088 B2 | 9/2019 | Fisher et al. | |

(Continued)

FOREIGN PATENT DOCUMENTS

WO    2008/013695 A2    1/2008

OTHER PUBLICATIONS

Chen, P.M., et al., "RAID: High-Performance, Reliable Secondary Storage", ACM Computing Surveys, Jun. 1994, pp. 145-185, vol. 26, No. 2.

(Continued)

*Primary Examiner* — Chae M Ko
(74) *Attorney, Agent, or Firm* — Scully, Scott, Murphy & Presser, P.C.

(57) ABSTRACT

Data protection systems and techniques that include: receiving data for storage in a non-volatile memory (NVM) array having a total number of physical packages that includes a number of spare physical packages, wherein each one of the physical packages is mapped to one of a plurality of logical packages; storing a respective portion of component codewords on the non-spare physical packages; and in response to one of the non-spare physical packages failing, dynamically remapping the failed physical package to one of the logical packages mapped to one of the available spare physical packages. In an aspect, reading at least the failed physical package and inserting virtual zeros into the respective portion of the component codewords corresponding to the failed physical package; performing erasure decoding to recover the data from the failed package; and rewriting the recovered data from the failed package into the one of the available spare physical packages.

20 Claims, 15 Drawing Sheets

(56) References Cited

U.S. PATENT DOCUMENTS

| | | | |
|---|---|---|---|
| 11,175,984 B1* | 11/2021 | Lercari | G06F 11/0784 |
| 2011/0131472 A1* | 6/2011 | Antonakopoulos | |
| | | | G06F 11/1028 |
| | | | 714/E11.034 |
| 2013/0191703 A1 | 7/2013 | Meaney et al. | |
| 2014/0337684 A1* | 11/2014 | Resch | G06F 11/10 |
| | | | 714/763 |
| 2016/0043742 A1 | 2/2016 | Cideciyan et al. | |
| 2017/0004056 A1* | 1/2017 | Iljazi | G06F 3/067 |
| 2017/0123888 A1* | 5/2017 | Blaum | G06F 11/1092 |
| 2018/0004601 A1 | 1/2018 | Lee et al. | |
| 2018/0095676 A1* | 4/2018 | Zhao | G06F 3/0611 |
| 2018/0203764 A1 | 7/2018 | Anderson | |
| 2020/0210335 A1* | 7/2020 | Sundrani | G06F 12/0804 |
| 2022/0019366 A1* | 1/2022 | Freilich | G06F 21/602 |

OTHER PUBLICATIONS

Hassner, M., et al., "Integrated Interleaving—A Novel ECC Architecture", IEEE Transactions on Magnetics, Mar. 2001, pp. 773-775, vol. 37, No. 2.

Blokh, E. L., et al., "Coding of Generalized Concatenated Codes," Plenum Publishing Corporation, 1976 (translated from Problemy Peredachi Informatsii, Jul.-Sep. 1974, pp. 218-222.

Maucher, J., et al. in "On the Equivalence of Generalized Concatenated Codes and Generalized Error Location Codes", IEEE Transactions on Information Theory, Mar. 2000, pp. 642-649, vol. 46, No. 2.

* cited by examiner

DYNAMIC MAPPING OF LOGICAL TO PHYSICAL MEMORY FOR INCREASED PERFORMANCE

BACKGROUND OF THE INVENTION

This disclosure relates to data processing and storage, and more specifically, to data protection techniques including error correcting code and redundant array of independent disk functionality with dynamic mapping for a memory array.

Memory is one of the more important components used in information handling systems, computer systems, storage solutions, and mobile devices. Performance, scalability, reliability, and cost of memory devices are major criteria in determining use of such devices. Typically, nearly all information handling systems, computer systems, storage solutions, mobile devices, and other computing based products use one or a combination of charge based volatile memories, such as for example, DRAM, and/or non-volatile memories, such as for example NAND flash. Storage Class Memory (SCM) is a non-volatile memory (NVM) that has application in information handling systems, computing systems, storage solutions (memory systems), and mobile devices.

Storage class memory (SCM) is a type of persistent memory that combines the low latency and byte-addressability of dynamic read access memory (DRAM) with the non-volatility, area density, and economical characteristics of traditional storage media. Examples of SCM technology include 3D XPoint, ReRam, and Spin Transfer Torque-Magnetic Random Access Memory (STT-MRAM). To achieve high capacity and fast access, non-volatile memory (NVM) arrays, for example, flash and SCM technology based devices, contain multiple chips/packages, which are accessed in parallel by the memory controller. Unfortunately, NVM devices tend to exhibit a relatively large raw bit error rate (RBER) as the devices tend to approach end of life.

Error detection and correction techniques protect and facilitate reliable storage of digital data in memory arrays. In sum, error detection techniques facilitate detecting data errors, while error correction techniques facilitate reconstruction of original data from corrupted data in many instances. An error-correcting code (ECC) is used for protecting a sequence of symbols such that errors introduced in the sequence of symbols can be detected and corrected (within limitations) based on symbols that are not corrupted. In general, error detection is less complex than error correction. Reed-Solomon (RS) codes are linear block-based ECCs that have a wide range of applications in digital communications and storage. RS codes are commonly used to correct errors in many electronic systems and are a subset of Bose-Chaudhuri-Hocquenghem (BCH) codes. An RS encoder receives a digital data block and adds extra parity symbols. An RS decoder processes each noisy data block and attempts to correct errors and recover original data based on the redundancy given by the extra parity symbols. The number and type of errors that can be corrected with an RS code depends on the characteristics of an implemented RS code. An RS code over the finite field GF ($2^s$) may be specified as RS(n, k) with s-bit symbols, which means that an RS encoder takes 'k' data symbols of 's' bits each, computes and adds symbols to make an 'n' symbol codeword, with 'n-k' added parity symbols of 's' bits each. In general, an RS decoder can correct up to T symbols that contain errors in a codeword, where t is the largest integer not exceeding (n-k)/2.

A redundant array of independent disks (RAID) refers to a data storage technology that has been used to combine multiple hard disk drives (HDDs) or solid state drives (SSDs) into a single logical unit for the purposes of data redundancy and/or performance improvement. RAID schemes are also used to protect and facilitate reliable storage and retrieval of digital data. With RAID, data is distributed across drives or memory in one of several ways, depending on the required level of redundancy and/or performance. Different RAID levels provide a different balance between capacity, performance, availability, and reliability. RAID levels greater than RAID '0' provide protection against unrecoverable sector read errors, as well as against failures of whole drives. Error Correction Code (ECC) and Redundant Array of Independent Disks (RAID) schemes are used to achieve high reliability and robustness against memory failures. To ensure high reliability of stored user data, a relatively strong ECC is required in connection with NVM devices. NVM devices are also subject to entire package failures, which can lead to substantial data loss (e.g., one or more packages). Achieving robust protection against data corruption and loss in memory systems, including memory systems implementing non-volatile memory (NVM) arrays, and protect against entire NVM package losses, would be advantageous.

BRIEF SUMMARY

The summary of the disclosure is given to aid understanding of a computer system, computer architectural structure, memory systems, memory controllers, Error Correction Code (ECC) including Reed-Solomon systems, RAID protection schemes, and methods of media management, and not with an intent to limit the disclosure or the invention. The present disclosure is directed to a person of ordinary skill in the art. It should be understood that various aspects and features of the disclosure may advantageously be used separately in some instances, or in combination with other aspects and features of the disclosure in other instances. Accordingly, variations and modifications may be made to the computer system, the architectural structure, processor, memory storage, memory controllers, the ECC schemes, RAID protection schemes, and their method of operation to achieve different effects.

Disclosed are methods, techniques, systems, and computer program products for storing and/or protecting data in a data storage system. In one or more embodiments a method of protecting the storage of data is disclosed, for example in a data storage system. The method in an embodiment includes: receiving, by a controller, the data for storage in a non-volatile memory (NVM) array of a data storage system having a total number P of physical packages that includes a number L of spare physical packages, wherein each one of the P physical packages is mapped to one of a plurality of logical packages; storing, by the controller, a respective portion of component codewords on the number (P-L) physical packages of the NVM array; and in response to one of the (P-L) physical packages failing, dynamically remapping the failed physical package to one of the logical packages mapped to one of the available spare physical packages. In an aspect, the method further includes reading at least the failed physical package and inserting virtual zeros into the respective portion of the component codewords corresponding to the failed physical package; performing erasure decoding to recover the data from the failed package; and rewriting the recovered data from the failed package into the one of the available spare physical packages. The method according to an aspect further includes remapping the failed physical package to a lowest order spare physical package, and/or switching the logical package mappings of both the failed physical package and the one of the available spare physical packages.

The method in one or more embodiments, during encoding of the L spare physical packages, further includes inserting virtual zeros into a data portion of the logical packages corresponding to the L spare physical packages. After remapping, in an embodiment, the method includes reading the component codewords from the P physical packages; for purposes of decoding the component codewords, inserting virtual zeros into the logical package that was remapped to the failed physical package; and sending the component codewords to decoders to recover the data from the failed physical package. In a further aspect, after remapping, the component codewords are read from the P physical packages; and for purposes of decoding the component codewords, virtual zeros are inserted into all the logical packages that are mapped to the spare physical packages. In an aspect, in response to the remapping of the failed physical package to one of the logical packages mapped to one of the L spare physical packages, the method includes updating a conversion look-up table containing mappings of the logical packages to the physical packages.

A data storage system is disclosed in one or more embodiments that includes: a non-volatile memory (NVM) array; and a controller coupled to the NVM array, wherein the controller is configured to: receive data for storage in the NVM array having a total number P of physical packages that includes a number L of spare physical packages, wherein each one of the P physical packages is mapped to one of a plurality of logical packages; store a respective portion of each of a component codeword on a number (P-L) of physical packages of the NVM array; in response to one of the (P-L) physical packages failing, dynamically remap the failed physical package to one of the logical packages mapped to one of the available spare physical packages; read the physical packages that are not spare physical packages and insert virtual zeros into the respective portion of the component codewords corresponding to the failed physical package and the spare physical packages; perform erasure decoding to recover the data originally stored in the failed physical package; and rewrite the recovered data originally stored in the failed package into the one of the available spare physical packages. The data storage system in an aspect is configured to switch the logical package mappings of both the failed physical package and the spare physical package. The data storage system in one or more aspects is further configured to, during the encoding of the spare physical packages, insert virtual zeros into a data portion of the logical packages corresponding to the spare physical packages. In an embodiment, the system is further configured to: read the component codewords from the logical packages that don't correspond to the spare physical packages; for purposes of decoding the component codewords, insert virtual zeros into the logical packages corresponding to the spare packages; and send the component codewords to decoders to recover the data originally stored in the failed physical package.

A computer program product is also disclosed. The computer program product in one or more embodiments includes a computer readable storage medium having program instructions embodied therein, the program instructions executable by a controller, to cause the controller to: receive data for storage in a non-volatile memory (NVM) array having a total number P of physical packages that includes a number L of spare physical packages, wherein each one of the P physical packages is mapped to one of a plurality of logical packages; store a respective portion of component codewords on a number (P-L) physical packages of the NVM array; dynamically remap, in response to one of the (P-L) physical packages failing, the failed physical package to one of the logical packages mapped to one of the L spare physical packages; read the physical packages that are not spare physical packages and insert virtual zeros into the respective portion of the component codewords corresponding to the failed physical package and the spare physical packages; perform erasure decoding to recover the data originally stored in the failed physical package; and rewrite the recovered data originally stored in the failed physical package into the one of the available spare physical packages.

The disclosed techniques may be implemented as a method, a data storage system, and/or a program product (including program code stored in a storage device).

The foregoing and other objects, features and advantages of the invention will be apparent from the following more particular descriptions of exemplary embodiments of the invention as illustrated in the accompanying drawings.

DETAILED DESCRIPTION

Figure 1A:
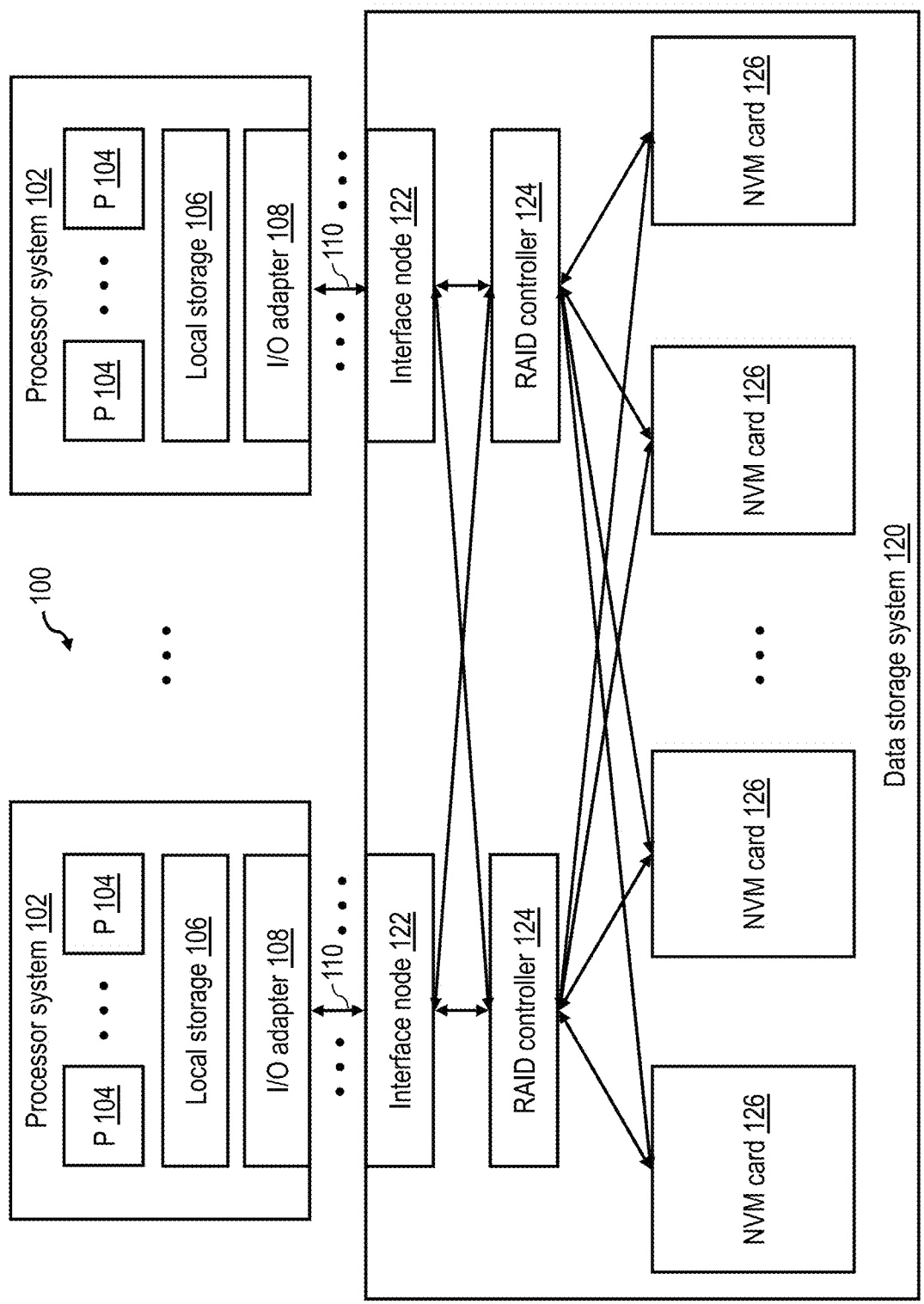
FIG. 1A is a high level block diagram of a data processing environment in accordance with one embodiment.

The following description is made for illustrating the general principles of the invention and is not meant to limit the inventive concepts claimed herein. In the following detailed description, numerous details are set forth in order to provide an understanding of the computer system, computer architectural structure, processors, memory systems, memory controllers, memory management and data protection, Error Correction Codes (ECC) including Reed-Solomon (RS) systems, RAID protection schemes, and their method of operation, however, it will be understood by those skilled in the art that different and numerous embodiments of the computer system, computer architectural structure, processor, memory systems, memory management and data protection, Error Correction Codes (ECC) including Reed-Solomon systems, RAID protection schemes, and their method of operation may be practiced without those specific details, and the claims and disclosure should not be limited to the arrangements, structures, systems, assemblies, subassemblies, circuitry, features, aspects, processes, methods, techniques, embodiments, and/or details specifically described and shown herein. Further, particular features, aspects, arrangements, systems, embodiments, techniques, etc. described herein can be used in combination with other described features, aspects, arrangements, systems, embodiments, techniques, etc. in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc. It must also be noted that, as used in the specification and the appended claims, the singular forms "a," "an" and "the" include plural referents unless otherwise specified, and that the terms "comprises" and/or "comprising," when used in this specification and claims, specify the presence of stated features, integers, aspects, arrangements, embodiments, structures, systems, assemblies, subassemblies, steps, operations, elements, and/or components, but do not preclude the presence or addition of one or more other features, integers, aspects, arrangements, embodiments, structures, systems, assemblies, subassemblies, steps, operations, elements, components, and/or groups thereof.

The following discussion omits or only briefly describes conventional features of information processing systems, including processors, microprocessor systems, memory systems, memory controllers, memory management and data protection, Error Correction Codes (ECC) including Reed-Solomon systems (Reed-Solomon encoders and decoders), RAID protection schemes, and their architectures, and their method of operation, which should be apparent to those skilled in the art. It is assumed that those skilled in the art are familiar with the general architecture and operation of processors, memory systems, and error detection and correction techniques and systems including RAID data protection, ECC including Reed-Solomon systems (Reed Solomon encoders and decoders), and their operation. It may be noted that a numbered element is numbered according to the figure in which the element is introduced, and is typically referred to by that number throughout succeeding figures.

NVM arrays have usually included a collection of packages (memory devices), with data flow between a host data processing system and the NVM array being controlled by a storage controller. An NVM array typically includes a predetermined number of packages, each of which include a predetermined number of dies. Typically, a storage controller has been configured to access data in all packages in parallel and, as such, the bandwidth of an NVM array has been proportional to the number of packages accessed in parallel. To achieve maximum bandwidth for a given number of packages it is desirable to read/write from/to a maximum number of packages, for which a storage controller is designed, in parallel. As the latency of accessing a data record depends on the size of the record, spreading a data record across multiple packages and accessing the data record in parallel tends to reduce data access latency.

According to the present disclosure, a high-bandwidth, high-efficiency, low-complexity data protection technique is disclosed that combines ECC and RAID functionality for next-generation NVM arrays. According to one embodiment, codewords (CWs) are spread across all packages of an NVM array and a package failure is recovered by erasure decoding. In one or more embodiments, a dynamic logical to physical package map is introduced to remap failed physical packages/chips to the logical packages associated with spare packages, and in one or more aspects erasure decoding is performed to recover the data from the failed package. In one or more embodiments, virtual zeros are written to the data part of the failed logical packages. The disclosed technique and system can support more than one chip/package failure. And, in the presence of failed packages that utilize the disclosed technique and system, the same or better Bit Error Rate (BER) and RAID protection is achieved than the original ECC/RAID scheme. The disclosed integrated ECC/RAID techniques can be advantageously implemented entirely in hardware, which avoids lengthy verification typically associated with firmware implementations.

With reference to the figures and with particular reference to FIG. 1A, there is illustrated a high level block diagram of an exemplary data processing environment 100 including a data storage system 120 that is configured to implement outer redundant array of independent disk (RAID) functionality across NVM cards 126 and data protection techniques that combine error correcting code (ECC) and redundant array of independent disk (RAID) functionality for a non-volatile memory (NVM) array within the NVM cards 126 according to the present disclosure. As shown, data processing environment 100 includes one or more hosts, such as a processor system 102 having one or more processors 104 that process instructions and data. Processor system 102 may additionally include local storage 106 (e.g., Dynamic Random Access Memory (DRAM) or disks) that may store program code, operands and/or execution results of the processing performed by processor(s) 104. In various embodiments, processor system 102 can be, for example, a mobile computing device (such as a smartphone or tablet), a laptop or desktop personal computer system, a server computer system (such as one of the POWER® series available from International Business Machines Corporation), or a mainframe computer system. Processor system 102 can also be an embedded processor system using various processors such as ARM®, POWER, Intel X86, or any other processor.

Each processor system 102 further includes an Input/Output (I/O) adapter 108 that is coupled directly (i.e., without any intervening device) or indirectly (i.e., through at least one intermediate device) to a data storage system 120 via an I/O channel 110. In various embodiments, an I/O channel 110 may employ any one or a combination of known or future developed communication protocols, including, for example, Fibre Channel (FC), FC over Ethernet (FCoE), Internet Small Computer System Interface (iSCSI), Infini-Band, Transport Control Protocol/Internet Protocol (TCP/IP), Peripheral Component Interconnect Express (PCIe), etc. I/O operations (IOPs) communicated via I/O channel 110 include read IOPs by which a processor system 102 requests data from data storage system 120 and write IOPs by which a processor system 102 requests storage of data in data storage system 120.

In the illustrated embodiment, data storage system 120 includes multiple interface nodes 122 through which data storage system 120 receives and responds to IOPs via I/O channels 110. Each interface node 122 is coupled to each of multiple outer Redundant Array of Inexpensive Disks (RAID) controllers 124 in order to facilitate fault tolerance and load balancing. Each of outer RAID controllers 124 is in turn coupled (e.g., by a PCIe bus) to each of multiple NVM cards 126 including, in this example, NVM storage media. In other embodiments, other lossy storage media can be employed.

Figure 1B:
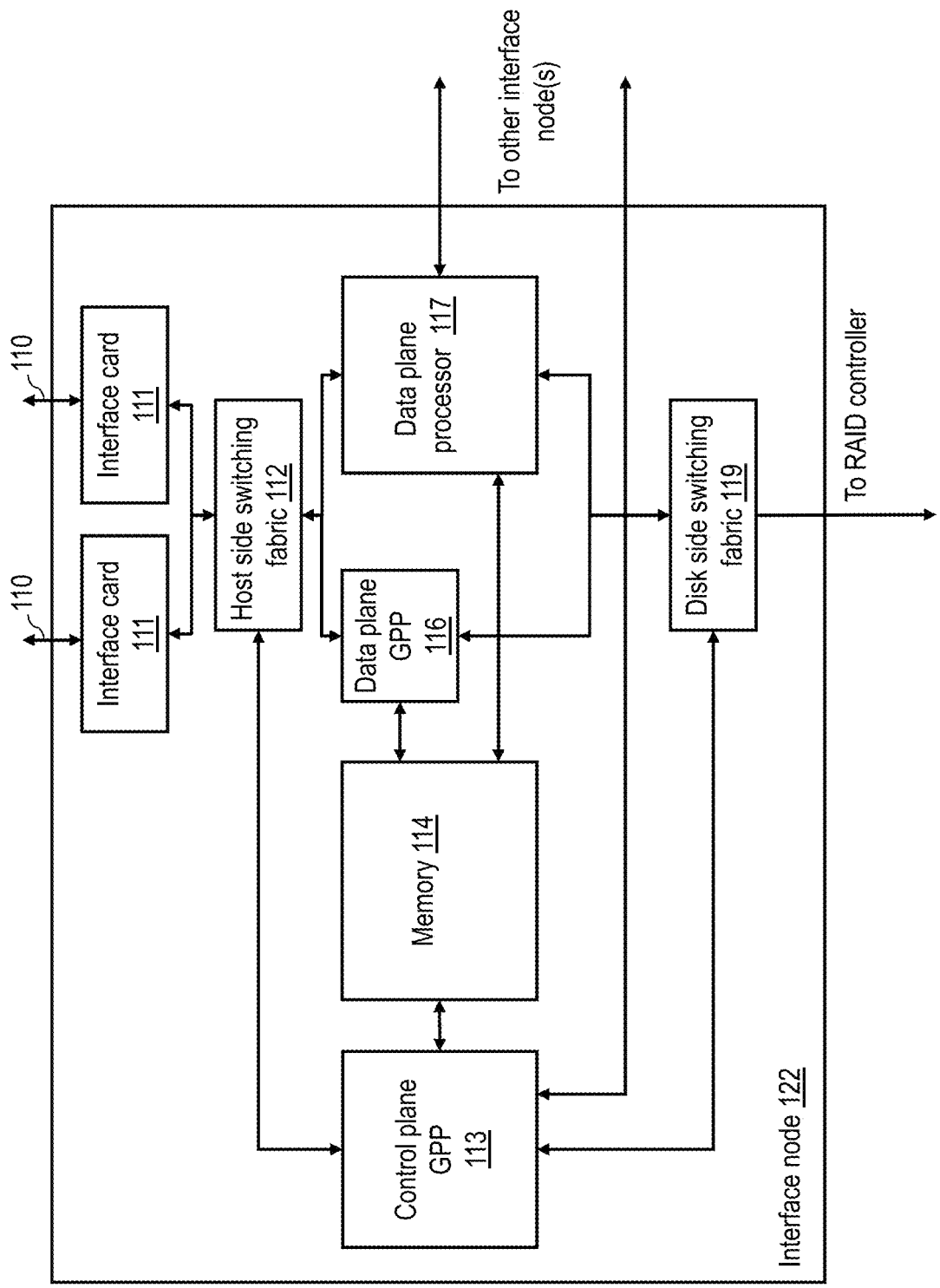
FIG. 1B is a more detailed block diagram of an exemplary interface node of the data storage system of FIG. 1A.

FIG. 1B depicts a more detailed block diagram of an interface node 122 of data storage system 120 of FIG. 1A. Interface node 122 includes one or more interface cards 111 that serve as an interface to processor systems 102 through I/O channels 110 and connect to host side switching fabric 112. The host side switching fabric 112 acts as a switch and handles all data transfers between interface cards 111 and processing units in interface node 122, namely control plane general purpose processor (GPP) 113, data plane GPP 116, and data plane processor 117. Typically, host side switching fabric 112 consist of a PCIe switch, but other switch technologies may be used as well. Data plane processor 117 is a special purpose processor that can be implemented, for example, by an Application Specific Integrated Circuit (ASIC) or a Field Programmable Gate Array (FPGA). Control plane GPP 113, data plane GPP 116, and data plane processor 117 are all connected to memory 114 which may be implemented as a shared memory between these components, separate memories, or a combination thereof.

In embodiments in which data plane processor 117 is implemented with an FPGA, control plane GPP 113 may program and configure data plane processor 117 during start-up of data storage system 120. Data plane GPP 116 and control plane GPP 113 control data plane processor 117 as well as access to NVM cards 126 either indirectly through the control of data plane processor 117 or directly through disk side switching fabric 119. Control plane GPP 113 executes system management functions as well as higher level services such as snapshots, thin provisioning, and deduplication. Data plane GPP 116 executes protocol specific functions. Control plane GPP 113, data plane GPP 116, and data plane processor 117 are connected to outer RAID controller 124 through disk side switching fabric 119 which typically consist of a PCIe switch, but other switch technologies may be used as well. FIG. 1B further illustrates control plane GPP 113 and data plane processor 117 being connected to other interface nodes 122 in data storage system 120 to handle fail-over scenarios or for performing other data synchronization functions.

Figure 1C:
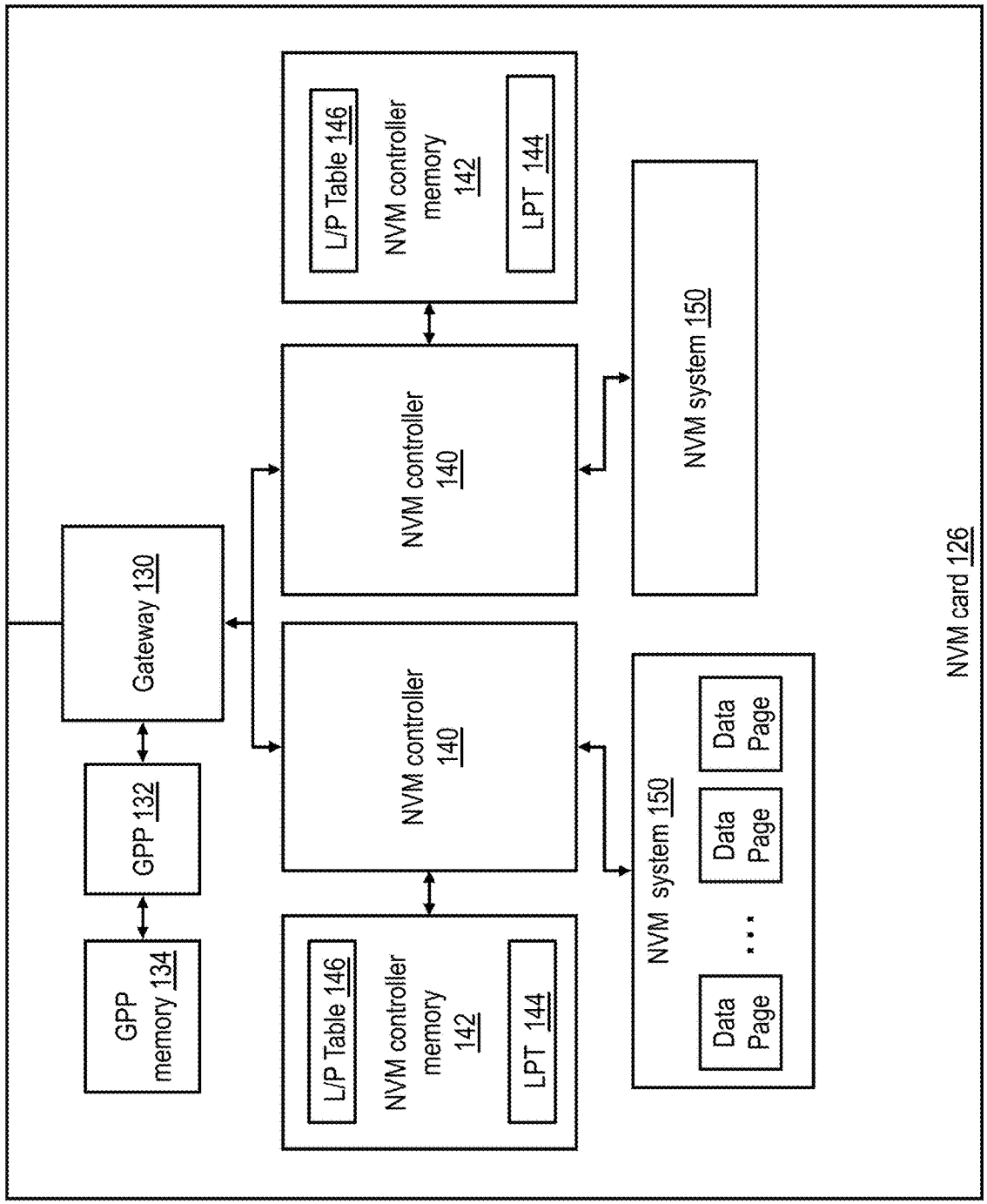
FIG. 1C is a more detailed block diagram of an exemplary non-volatile memory (NVM) card of the data storage system of FIG. 1A.

FIG. 1C depicts a more detailed block diagram of an NVM card 126 of data storage system 120 of FIG. 1A. NVM card 126 includes a gateway 130 that serves as an interface between NVM card 126 and outer RAID controllers 124. Gateway 130 is coupled to a general-purpose processor (GPP) 132, which can be configured (e.g., by program code) to perform various management functions, such as pre-processing of IOPs received by gateway 130 and/or to schedule servicing of the IOPs by NVM card 126. GPP 132 is coupled to a GPP memory 134 (e.g., Dynamic Random Access Memory (DRAM) or Magneto-resistive Random Access Memory (MRAM)) that can conveniently buffer data created, referenced and/or modified by GPP 132 in the course of its processing.

Gateway 130 is further coupled to multiple NVM controllers 140, each of which controls a respective NVM system 150. The NVM controllers 140 implement the combined ECC/RAID data protection techniques and dynamic logical package to physical package remapping for a NVM array according to the present disclosure. NVM controllers 140 can be implemented, for example, by an Application Specific Integrated Circuit (ASIC) or a Field Programmable Gate Array (FPGA) having an associated NVM controller memory 142 (e.g., DRAM). In embodiments in which NVM controllers 140 are implemented with an FPGA, GPP 132 may program and configure NVM controllers 140 during start-up of data storage system 120. After startup, in general operation NVM controllers 140 receive read and write IOPs from gateway 130 that request to read data stored in NVM system 150 and/or to store data in NVM system 150. NVM controllers 140 service these IOPs, for example, by accessing NVM systems 150 to read or write the requested data from or into NVM systems 150 or by accessing one or more read and/or write caches (not illustrated in FIG. 1C) associated with NVM systems 150.

NVM controllers 140 implement a translation layer that provides logical-to-physical address translation to enable access to specific memory locations within NVM systems 150. In general, an IOP received by NVM controller 140 from a host device, such as a processor system 102, contains the logical block address (LBA) at which the data is to be accessed (read or written) and, if a write IOP, the write data to be written to data storage system 120. The IOP may also specify the amount (or size) of the data to be accessed. Other information may also be communicated depending on the protocol and features supported by data storage system 120. The LBA provided by the host device corresponds to a logical page within a logical address space. The translation layer translates this LBA into a physical address assigned to a corresponding physical location in a NVM system 150.

NVM controllers 140 may perform address translation and/or store mappings between logical and physical addresses in a logical-to-physical translation data structure, such as logical-to-physical translation (LPT) table 144, which may conveniently be stored in NVM controller memory 142. LPT table 144 may also be configured to store compressed page sizes of data pages stored in NVM system 150 and even further their CRC values.

Figure 2:
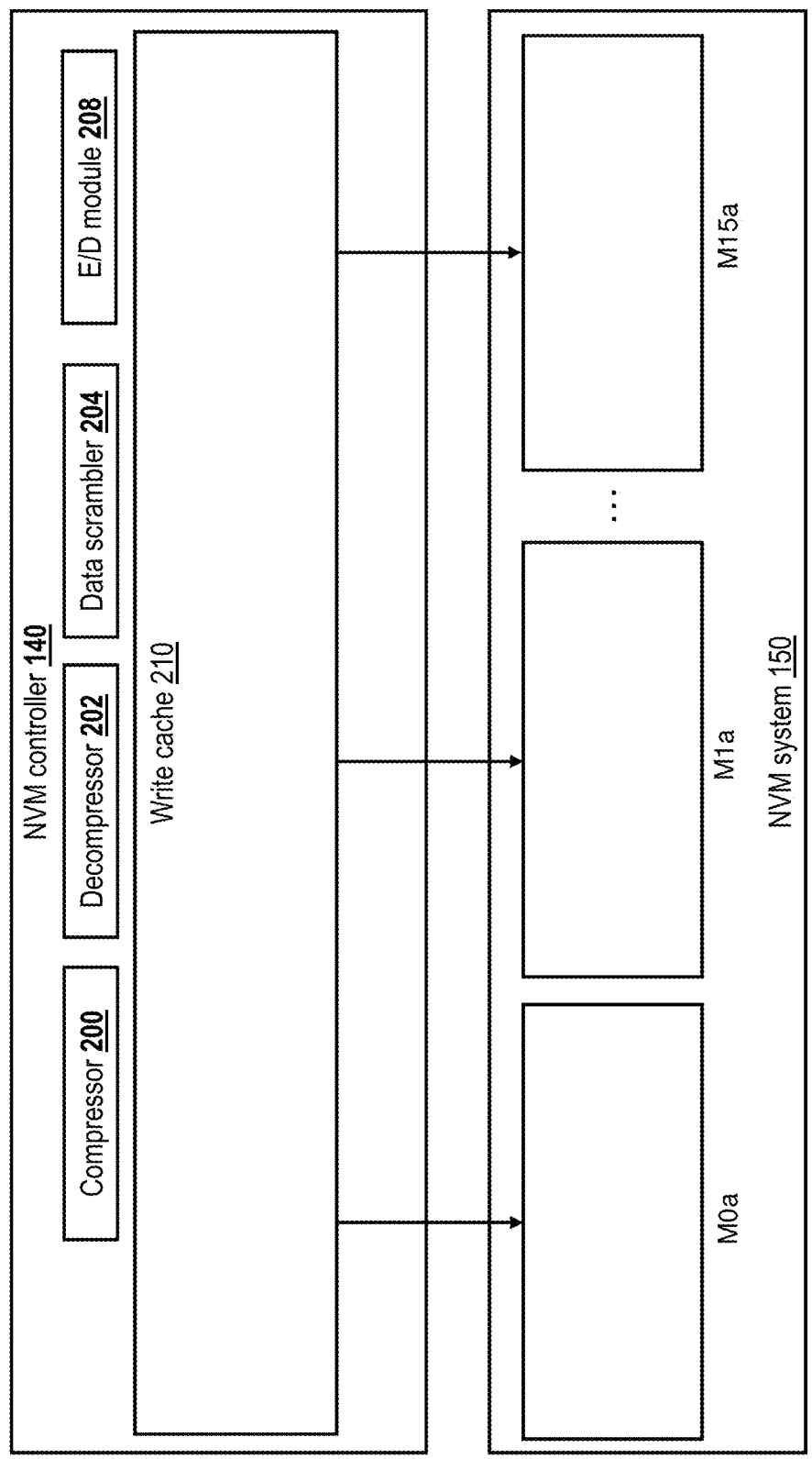
FIG. 2 depicts a more detailed view of an exemplary NVM controller and an exemplary NVM system of FIG. 1C.

NVM systems 150 may take many forms in various embodiments. Referring now to FIG. 2, there is depicted one exemplary arrangement of physical memory within a NVM system 150 in accordance with one exemplary embodiment.

NVM system 150 may be formed from a number, for example thirty-two (32), of individually addressable NVM storage devices, which will be referred to as packages. In the illustrated example, each of the NVM storage devices takes the form of a board-mounted NVM module capable of storing one, two or more bits per cell. Thus, NVM modules may be implemented with Single Level Cell (SLC), Multi-Level Cell (MLC), Three Level Cell (TLC), Quad Level Cell (QLC) memory, or another type of NVM. The thirty-two NVM modules are arranged in sixteen groups of two, (M0a, M0b) through (M15a, M15b). For purposes of the physical addressing scheme, each group of two modules forms a "lane," also sometimes referred to as a "channel," such that NVM system 150 includes sixteen channels or lanes (Lane0-Lane15). While the example illustrates the use of thirty-two packages, it will be appreciated that there can be more or less packages, e.g., twenty-four, and they can be arranged in more or less groups, and the groups can have an equal or unequal number of packages.

In a preferred embodiment, each of the individual lanes has a respective associated bus coupling it to the associated NVM controller 140. Thus, by directing its communications to one of the specific communication buses, NVM controller 140 can direct its communications to one of the lanes of memory modules. Because each communication bus for a given lane is independent of the communication buses for the other lanes, a NVM controller 140 can issue commands and send or receive data across the various communication buses at the same time, enabling the NVM controller 140 to access the NVM modules corresponding to the individual lanes at, or very nearly at, the same time.

In the illustrated embodiment, NVM controller 140 includes a compressor 200 that selectively applies one or more data compression algorithms to data written to the associated NVM system 150, a decompressor 202 that decompresses compressed data read from NVM system 150, and a data scrambler 204. NVM controller 140 utilizes data scrambler 204 to apply a predetermined data scrambling (i.e., randomization) pattern to data written to NVM memory 150 in order to improve endurance. NVM controller 140 in one or more embodiments includes an encoder and decoder (E/D) module 208. As explained in further detail the E/D module 208 is used to encode and decode data to improve reliability. NVM controller 240 in one or more embodiments includes a logical package to physical package mapper. A look-up conversion table 146 containing the mapping of the logical to physical packages in an aspect is kept in NVM controller memory 142. The look-up conversion table 146, also referred to as L/P module 146, can also persistent in the NVM controller 140, in the NVM media card 126, e.g., in DRAM and/or in NVM memory, such as, for example in packages. As further illustrated in FIG. 2, NVM controller 140 includes a write cache 210. Write cache 210 includes storage for one or more cache lines for buffering write data in anticipation of writing the data to NVM system 150.

According to various aspects of the present disclosure, each codeword (CW) is spread across all packages of an NVM array. In one or more embodiments, an implemented ECC is a concatenated (two-tier) code that includes short interleaved Reed-Solomon (RS) codes (i.e., C1 codes) that are protected by a strong RS sub-code (i.e., a C2 code). By spreading CWs across all packages, data access times are minimized, which leads to higher bandwidths. In various embodiments, implementing a two-tier code protects against any single package failure while providing for the correction of random errors. In general, implementing a concatenated RS-based code reduces hardware complexity (as contrasted with a single long code), offers an improved bit-error-rate performance/code rate (as compared to short interleaved codes), and offers faster decoding as in most cases the fast C1 decoder is used and the slower more complex C2 decoder is not needed (two-tier decoding principle).

Figure 3:
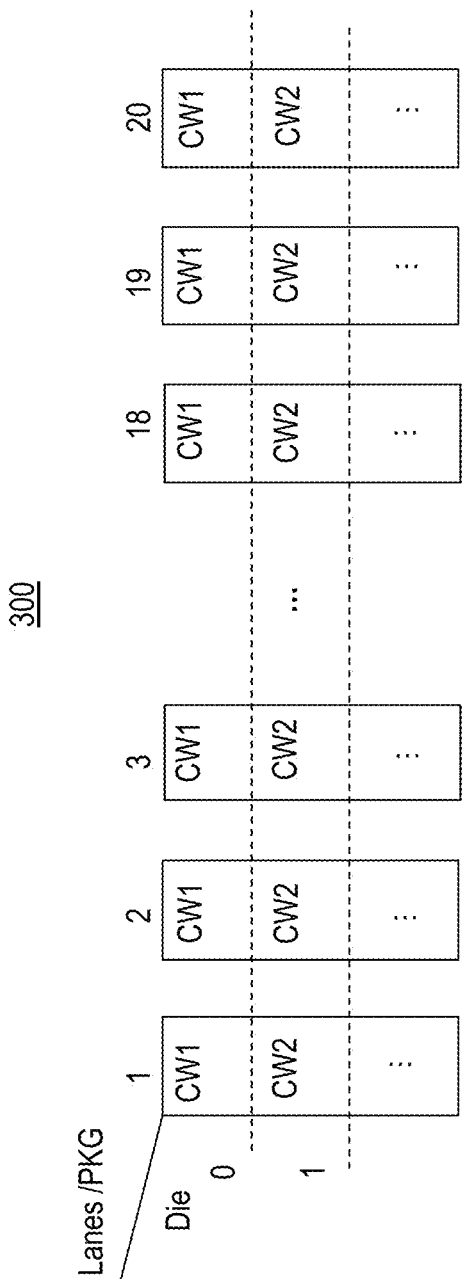
FIG. 3 is a diagram that depicts an exemplary codeword (CW) spread across packages of an NVM array according to one aspect of the present disclosure.
Figure 4:
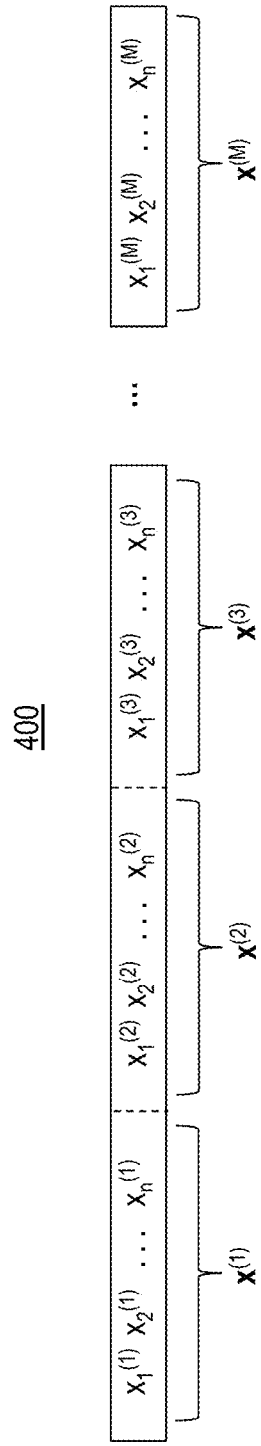
FIG. 4 is a diagram that depicts an exemplary concatenated CW that includes a number of component codewords according to an aspect of the present disclosure.

With reference to FIG. 3, a diagram 300 illustrates an exemplary concatenated codeword (CW) that is spread across twenty packages (P=20) of an NVM array, according to an aspect of the present disclosure. While twenty packages are illustrated in FIG. 3, it should be appreciated that the disclosed techniques are applicable to NVM arrays that include more or less than twenty packages. With reference to FIG. 4, a diagram 400 further depicts an exemplary concatenated CW x that includes 'M' component codewords $x^{(1)}$, $x^{(2)}$, $x^{(3)}$, . . . , $x^{(M)}$, which satisfy the following encoding constraints:

a) each component codeword belongs to a length-n code C1 (local constraint: level-1); and b) the XOR sum $x^{(1)} \oplus x^{(2)} \oplus . . . \oplus x^{(M)}$ belongs to a sub-code C2 of C1 (global constraint: level-2).

When C1 and C2 are Reed-Solomon (RS) codes the class of concatenated codes has been referred to as Integrated Interleaved Codes, as described in "Integrated Interleaving—A Novel ECC Architecture," M. Hassner, et al., IEEE Trans. on Magn., vol. 37, no. 2, pp. 773-775, March 2001, and U.S. Pat. Nos. 5,946,328, 5,942,005 and 7,231,578 B2. Such two-level coding schemes using interleaved RS codes have been employed in HDDs. These systems are based on the generalized concatenated codes described, for example, by E. L. Blokh and V. V. Zyablov in "Generalized concatenated codes," Plenum Publishing Corporation, pp. 218-222, 1976 (translated from Problemy Peredachi Informatsii, vol. 10, No. 3, pp. 45-50, July-September, 1974); and by J. Maucher et al. in "On the Equivalence of Generalized Concatenated Codes and Generalized Error Location Codes", IEEE Trans. on Information Theory, vol. 46, no. 2, March 2000.

The two-level RS coding scheme of Hassner et al. referenced above uses first and second level RS codes, denoted by C1 and C2 respectively, where the second RS code is a sub-code of the first RS code. Code constructions of concatenated codes satisfying local and global constraints a) and b) mentioned above are not limited to RS codes but can be extended to more general classes of codes such as BCH codes (see U.S. Pat. No. 8,930,798). In particular, the global constraint b) can be generalized to multiple constraints in the form of predetermined linear combinations of the M first codewords producing a second codeword of the C2 subcode. It should be appreciated that a concatenated CW configured according to the present disclosure may include any number of component codewords. In one embodiment, 'M' is equal to five and four C1-encoders are implemented in conjunction with a single C2-encoder. In one or more embodiments, C1 and C2 are 8-bit-symbol Reed-Solomon (RS) codes RS(n, $k_1$, $t_1$, $e_1$) and RS(n, $k_2$, $t_2$, $e_2$), respectively, where 'n' corresponds to the length of the codes in bytes, $k_1$ corresponds to the number of user/data bytes in the C1 code, $t_1$ corresponds to the number of errors that can be corrected by the C1 code, $e_1$ corresponds to the number of byte erasures that can be corrected by the C1 code, $k_2$ corresponds to the number of user/data bytes in the C2 code, $t_2$ corresponds to the number of errors that can be corrected by the C2 code, and $e_2$ corresponds to the number of byte erasures that can be corrected by the C2 code. It should be appreciated that the class of RS and BCH codes permits use of low-complexity error-and-erasure decoding algorithms, which is important to achieve high (readback) bandwidth.

In one or more embodiments, a last component $x^{(M)}$ of the concatenated CW x is derived by exclusive ORing (XORing) the C2 codeword with the C1 codewords in each concatenated CW. In one or more embodiments, the concatenated CW x can correct up to $t_1$ errors in each component codeword (tier 1) and $t_2$ errors in the worst component codeword (tier 2). As one example, for a concatenated CW having five component codewords each with a length 'n' of 248B, a length 'N' of the concatenated CW is 1240B (i.e., N=5×248B). For example, $k_1$ may be set equal to 209 and $k_2$ may be set equal to 195, which corresponds to $t_1$=13, $e_1$=13 and $t_2$=20, $e_2$=13, respectively. The resulting length (1240B) concatenated code can encode K=4$k_1$+$k_2$=1031 bytes of user data. Assuming an NVM array having twenty packages (i.e., P=20) with each package having 64B there are two spare bytes per package (i.e., 1240B=20×62B) that can be used to replace bytes that fail prematurely.

As another example, assume a concatenated CW x including twelve component codewords (i.e., M=12) $x^{(1)}$-$x^{(12)}$ and twenty-four packages (i.e., P=24) in an NVM array, a C1 code defined by an 8-bit-symbol RS(n=216, $k_1$=179, $t_1$=13, $e_1$=9) can be used to provide eleven component codewords and a C2 code defined by an 8-bit-symbol RS(n=216, $k_2$=165, $t_2$=20, $e_2$=9) can be used to generate a C2-codeword, which (by XORing with the first eleven component codewords) provides a single component codeword (twelve component codes in total) to provide data protection according to the present disclosure. In this case, n/P=9 bytes (216/24) from each of the twelve component codewords is written to each package, which facilitates recovery from a single package failure. More generally, if the length n of the component codewords is a multiple of the number of packages P, the mapping of ECC data to packages assigns n/P symbols from each of the M component codes to each package. In this case, a uniform spreading of the component codewords to each package is achieved, i.e., each package contains exactly n/P symbols from each of the M component codewords, which adds up to M×n/P symbols per package and to a total of M×n symbols across all P packages. If the length n of the component codewords is not a multiple P, a fully uniform spreading is not possible and in one or more embodiments, it is advantageous to achieve a spreading that is as uniform as possible. As uniform as possible spreading is achieved by having each package receive at most e=ceil (n/P) symbols but no less than e−1 symbols from each of the M component codewords, where ceil denotes the smallest integer that is larger or equal to n/P.

The parameter e determines the required erasure capability of the C1 and C2 codes, which is needed to recover from a single package failure. The disclosed mapping of ECC data to packages achieves maximum equal spreading of each of the component codewords across all packages. In general, there are many ways to achieve a maximum equal spreading, e.g., the nine bytes from each of the twelve component codewords can be adjacent bytes in the component codeword but also many other non-adjacent configurations are possible. This maximum equal spreading property ensures that the erased data from a package failure is evenly distributed across all component codewords and therefore the least number of bytes will be erased on each component codeword. Thus, when designing the ECC and selecting the ECC parameters of the C1 and C2 codes, the maximum equal spreading property allows one to choose the erasure correction capability e of the C1 and C2 codes as small as possible, which results in the largest possible code rate of the concatenated code.

Figure 5:
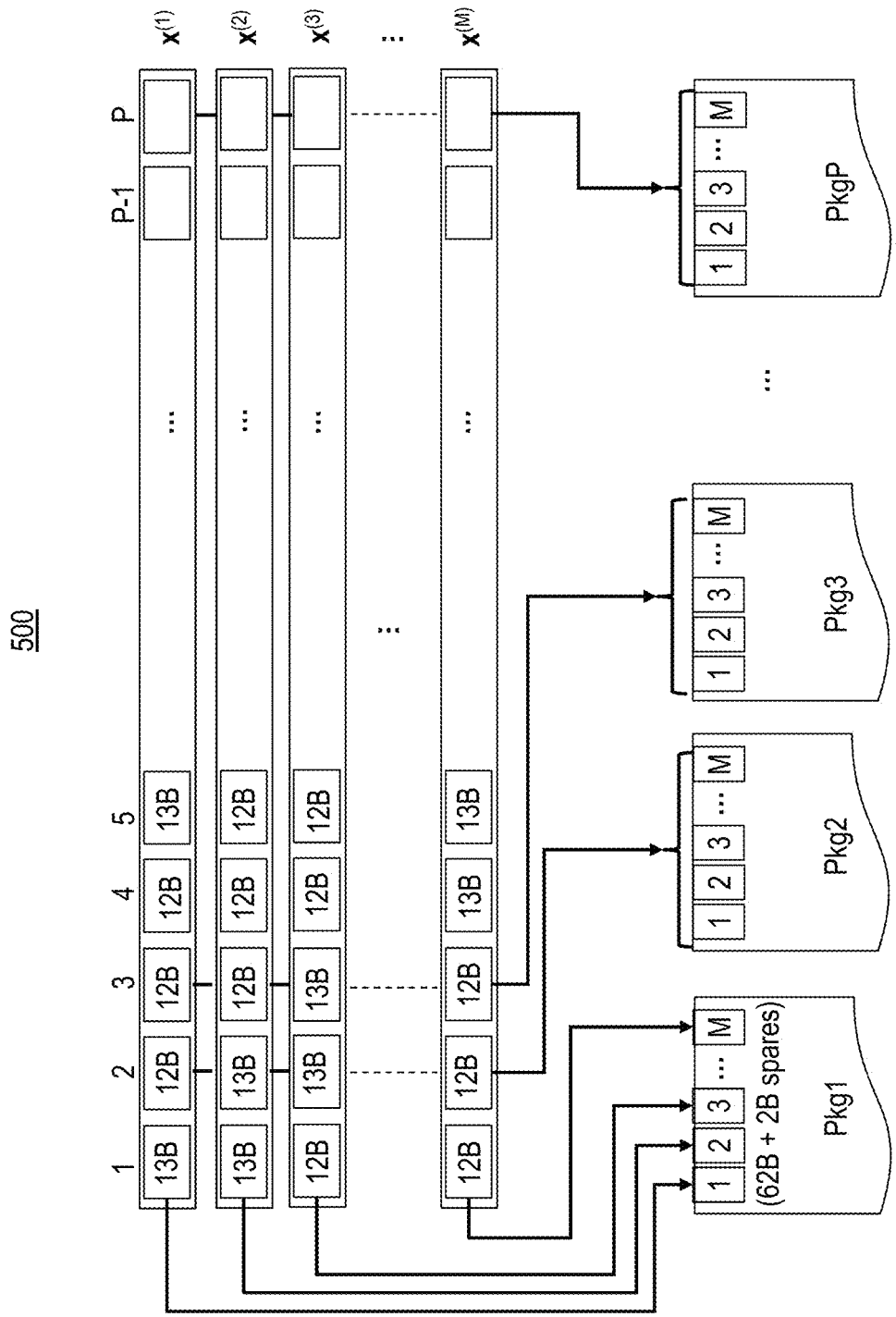
FIG. 5 is a diagram that depicts exemplary interleaving with maximum equal spreading of data from the component codewords ($x^{(1)}$-$x^{(M)}$) to packages (Pkg1-PkgP) in accordance with one embodiment of the present disclosure.

With reference to FIG. 5, a diagram 500 depicts an exemplary interleaving of data from component codewords to packages in accordance with one embodiment of the present disclosure. As is illustrated, data from each component codeword $x^{(1)}$, $x^{(2)}$, . . . , $x^{(M)}$, of a concatenated CW x is assigned to each package. This ECC data to package mapping is exemplified for the 1240B length concatenated code with K=1031 user/data bytes and five (i.e., M=5) component codewords of length n=248 described above. As one example, for a concatenated CW x with five component codewords $x^{(1)}$-$x^{(12)}$ and twenty packages (P=20) in an NVM array, a first 13B of component codeword $x^{(1)}$, a first 13B of component codeword $x^{(2)}$, a first 12B of component codeword $x^{(3)}$, a first 12B of component codeword $x^{(4)}$, and a first 12B of component codeword $x^{(5)}$ may be allocated to a first package of an NVM array (13B+13B+12B+12B+12B=62B). Similarly, a next 12B of component codeword $x^{(1)}$, a next 13B of component codeword $x^{(2)}$, a next 13B of component codeword $x^{(3)}$, a next 12B of component codeword $x^{(4)}$, and a next 12B of component codeword $x^{(5)}$ may be allocated to a second package of an NVM array with a size of subsequent bytes from the component codewords being rotated for successive packages. It should be appreciated that different allocations may be made provided that each package is allocated the same overall data bytes (e.g., in this case 62B) from a CW x, that all data bytes in a CW x are allocated to a package, and that the implemented C1 and C2 codes can correct erasures for the maximum amount of e=ceil(n/P) bytes (13B in this example) in the event of a single package failure. This mapping of ECC data to packages achieves maximum equal spreading of each of the component codewords across all packages.

Figure 6:
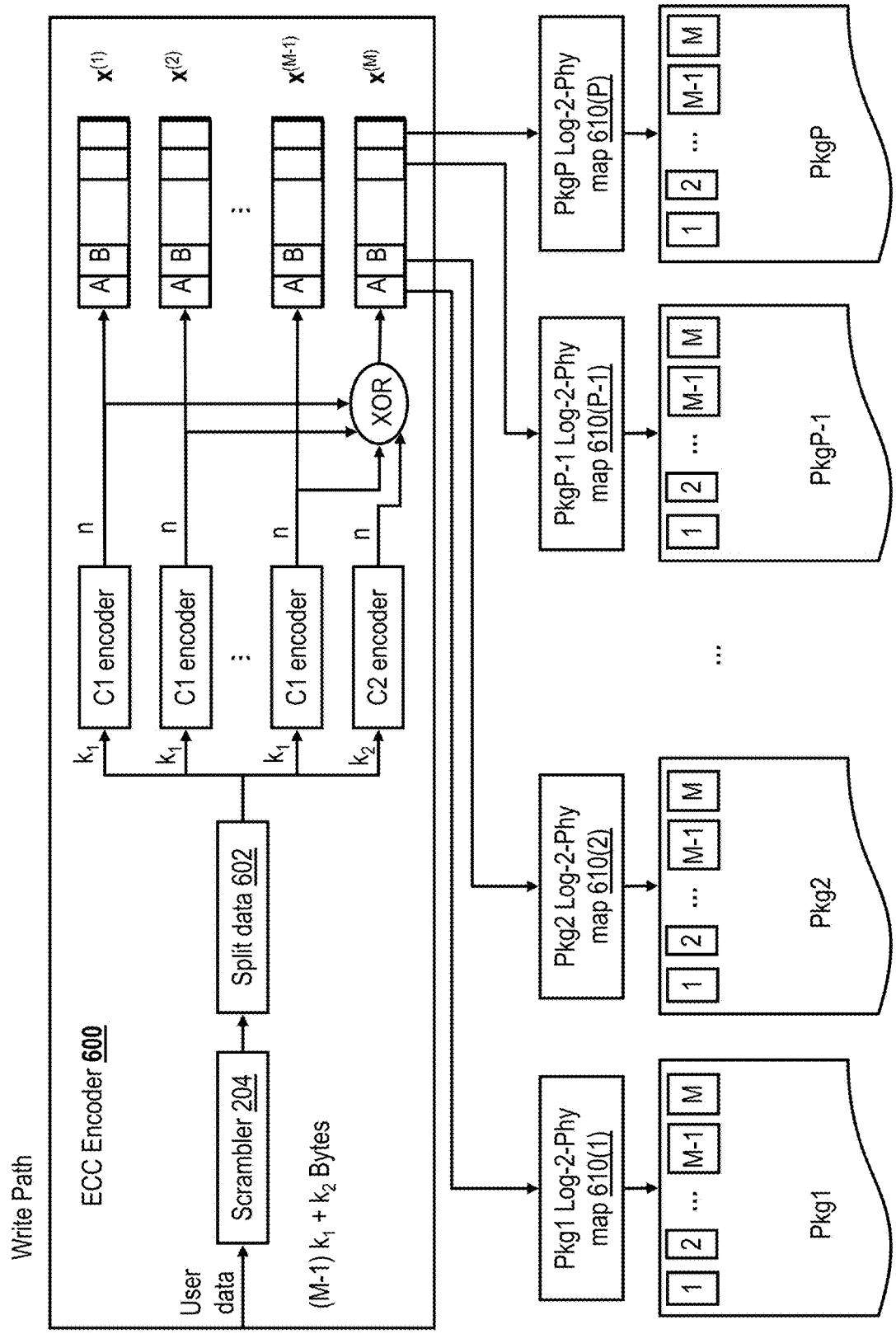
FIG. 6 depicts an exemplary encoder for encoding component codewords for a concatenated CW and interleaving with maximum equal spreading of data from the component codewords to packages in accordance with one embodiment of the present disclosure.

During writing IOPs, encoder 600 is used to encode data to be stored in NVM system 150. With reference to FIG. 6, an exemplary encoder 600 for creating component codewords (i.e., $x^{(1)}$, . . . , $x^{(M)}$) for a concatenated CW (i.e., x) is further illustrated in conjunction with the interleaving of data from the component codewords to packages of an NVM array in accordance with an embodiment of the present disclosure. As illustrated, encoder 600 includes a data scrambler 204, a split data module 602, multiple (i.e., M−1) C1 encoders, a single C2 encoder, and XOR logic that XORs outputs of the C1 and C2 encoders to generate a last component codeword $x^{(M)}$ for each concatenated CW. As one example, for a concatenated CW x that includes twelve component codewords (i.e., M=12 sub-codewords) $x^{(1)}$-$x^{(12)}$, eleven C1 encoders, and one C2 encoder are implemented. As is shown, during a data writing IOP, data scrambler 204 receives (M−1)×$k_1$+$k_2$ bytes of user data for each concatenated CW and scrambles the user data, which is then provided to an input of split data module 602. Split data module 602 splits the scrambled user data and then routes designated portions of the split scrambled user data to respective inputs of the C1 encoders and the C2 encoder. Each of the C1 and C2 encoders receive a designated portion of the split scrambled user data, encodes the designated portion of the split scrambled user data (adds parity bits to the user data), and then provide 'n' bytes of encoded data at their respective outputs that correspond to respective component codeword $x^{(1)}$, $x^{(2)}$, . . . , $x^{(M)}$, of the concatenated CW x, where $x^{(12)}$.

A logical to physical map 610 is provided that maps a logical package to a physical package. A respective portion or chunk "c" of the encoded data in each component codeword $x^{(1)}$ $x^{(2)}$ . . . , $x^{(M)}$, of the concatenated CW x is assigned to each logical package based on the maximum equal spreading property as discussed in conjunction with FIG. 5. For example, as shown in FIG. 6, first portions "A" of component codewords $x^{(1)}$ through $x^{(12)}$ are assigned to logical package 1, e.g., a first portion "A" of $x^{(1)}$, a first portion "A" of component codeword $x^{(2)}$, . . . , a first portion "A" of component codeword $x^{(M-1)}$, and a first portion "A" of component codeword $x^{(M)}$ are assigned to logical package 1. Next (second) portions "B" of component codewords $x^{(1)}$ through $x^{(12)}$ are assigned to logical package 2, e.g., a next (second) portion "B" of component codeword $x^{(1)}$, a next (second) portion "B" of component codeword $x^{(2)}$, . . . , a next (second) portion "B" of component codeword $x^{(M-1)}$, and a next (second) portion "B" of component codeword $x^{(M)}$ are assigned to logical package 2. The next (third) portions "C" of component codewords $x^{(1)}$ through $x^{(12)}$ are assigned to logical package 3, and so on until all respective portions of the component codewords $x^{(1)}, x^{(2)}, \ldots, x^{(M)}$, of the concatenated CW x are assigned to a logical package, e.g., to P packages. Logical package 1 is mapped to physical package 1 as shown by Logical to Physical Map 610(1), logical package 2 is mapped to physical package 2 as shown in Logical to Physical Map 610(2), etc. While a direct mapping of logical to physical packages is shown in FIG. 6, other mappings of logical packages to physical packages are contemplated. The mapping of the logical to physical packages in one or more aspects can be kept in a conversion table, for example, located in NVM controller memory 142, in NVM controller 140, and/or in NVM media card 126 (for example in NVM packages and/or other non-volatile memory, e.g., battery-backed DRAM and/or MRAM). The conversion table containing the mapping of logical packages to physical packages can be stored in other locations in the system. The conversion table in an embodiment can be battery-backed DRAM and/or MRAM, and include a number of entries equal to the number of packages P. Depending upon the design of the system, and for example in the situation where the logical package is directly mapped to the physical package, a conversion table holding the mapping of the logical packages to the physical packages may be unnecessary.

The size of the respective portion, e.g., chunk "A", "B", "C", etc., of the component codewords $x^{(1)}-x^{(M)}$ assigned to each logical package and physical package will depend upon the number of packages "P" and the size of the concatenated codeword x, where the portion size or chunk "c" is the size "n" of the concatenated codeword x divided by the number of packages, or c=n/P. In a preferred embodiment, the erasure capability "e" of the RS decoder should be greater than or equal to chunk "c" (e≥c or e≥n/P), and preferably an even integer multiple of "c" (e/c=1, 2, 3, etc. or n/P=1, 2, 3, etc.), for example 1. In this manner, the system will be able to correct erasures for at least one failed package and with low overhead. For example, a system that can correct erasures in one package can have, in an embodiment, twelve component or sub-codewords $x^{(1)}-x^{(12)}$ (M=12) so that there are eleven C1 encoders, and one C2 encoder, interleaving data over twenty-four packages (P=24), in for example, NVM system 150 on NVM card 126, using a C1 code defined by an 8-bit symbol: RS(n=216, $k_1$=179, $t_1$=13, e=9) and a C2 code defined by an eight-bit symbol: RS(n=216, $k_2$=165, $t_2$=20, e=9). Each chunk c can have nine (9) bytes (c=9), which is equal to erasure correction ability e (c=e=9 and e/c=1).

Figure 7:
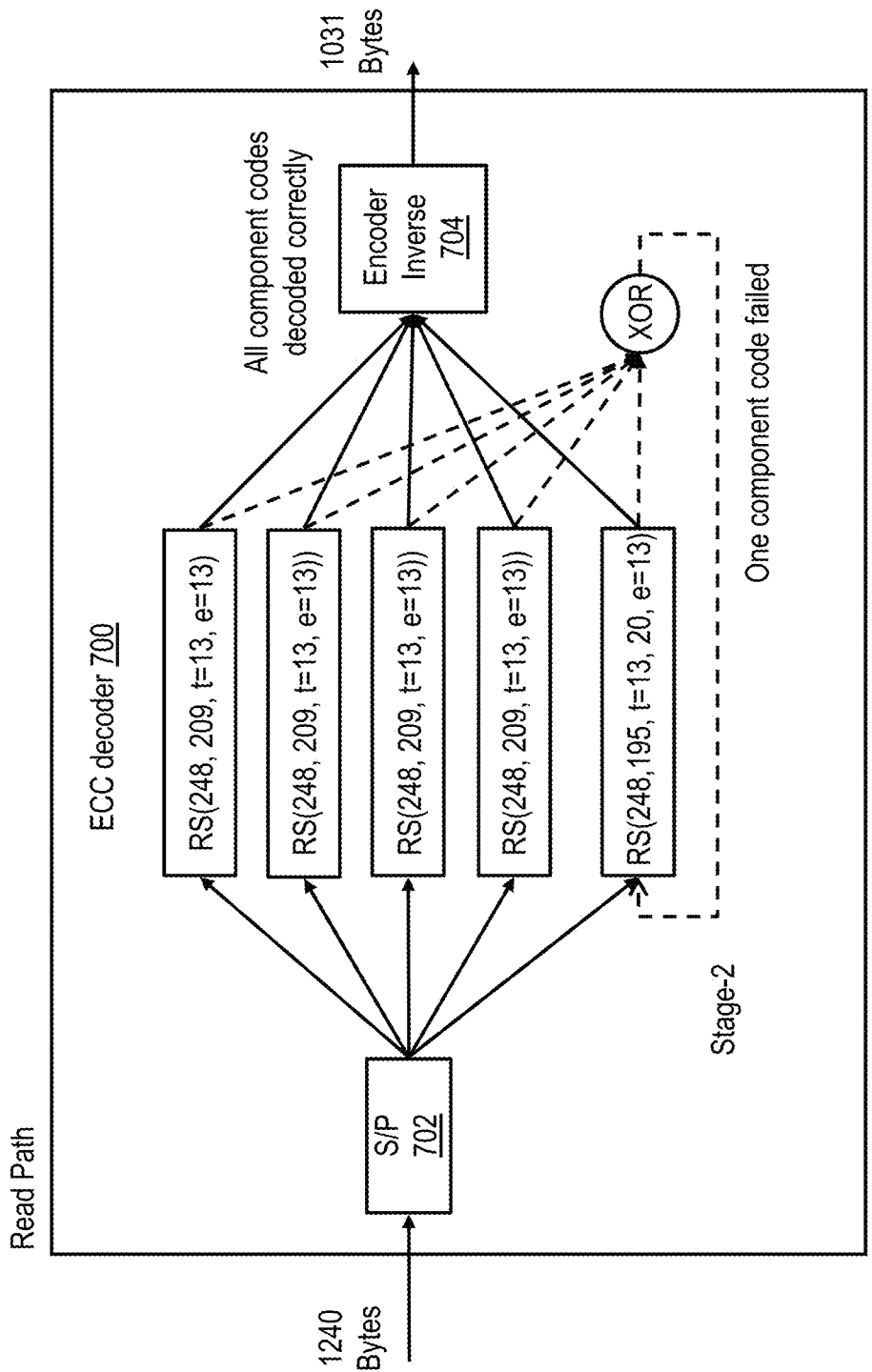
FIG. 7 depicts an exemplary decoder for decoding concatenated CWs in accordance with one embodiment of the present disclosure.

The system is configured to process read IOPs to obtain data stored in data storage system 120. The system uses a decoder for decoding the concatenated CWs. With reference to FIG. 7, an exemplary ECC decoder 700 for decoding concatenated CWs, in accordance with one embodiment of the present disclosure, is illustrated for the length-1240 concatenated code with K=1031 user/data bytes described above. In the illustrated embodiment, ECC decoder 700 includes five decoders (i.e., four C1 decoders defined by RS(n=248, $k_1$=209, $t_1$=13, e=13) and one C1/C2 decoder defined by RS(n=248, $k_{112}$=209, 195, $t_{112}$=13, 20, e=13)) used to decode different component codewords corrupted by errors of a concatenated CW that includes five component codewords. The data is read from the packages and input into ECC decoder 700 pipeline that includes a serial-to-parallel (S/P) converter 702, the decoders (five decoders in this example) and an encoder inverse module 704. The serial data from the packages is fed into S/P converter 702 and split into M component codewords that are fed into the decoders. In ECC decoder 700 each noisy component codeword is decoded independently in a first round (tier 1). If all noisy component codewords are decoded successfully in the first round, the outputs of the decoders are combined by module 704 and provided at the output of module 704.

If one component is not decoded successfully, a second round of decoding is required (stage/tier 2), as illustrated by phantom lines showing stage 2 loop in FIG. 7. The second round of decoding is performed by a C1/C2 decoder that is configured to perform C1 decoding in the first round (tier 1) and C2 decoding in the second round (tier 2). In tier-2 decoding mode, the noisy component codeword that has failed C1 decoding is XORed with all the four (M−1=4) successfully decoded component codewords and this XOR sum is passed to the C1/C2 decoder, which operates in C2 decoding mode. Typically tier-2 decoding is required very seldomly (in this case only about once in $10^8$ frames). In the event that a single package fails, error and erasure decoding is performed to recover the erased data associated with the single failed package. If all component codewords are decoded successfully in the first or second round, the outputs of the decoders are combined by module 704 and provided at the output of module 704.

While the disclosed combined ECC/RAID protection provides improved data protection, after a permanent package failure, the combined ECC/RAID scheme can still recover from random errors, however, the system will have reduced reliability because it cannot recover from a second package failure. An improved system and technique that can support more than one package failure is disclosed that also, in the face of additional failed packages, provides the same or better Bit Error Rate (BER) reliability and RAID protection as the system and method described above. In one or more embodiments, a number of spare physical packages are provided as well as a dynamic logical package to physical package mapper. That is, the system can update and remap the logical to physical package mapping, and in an aspect updates the logical to physical package mapping in response to a package failure. In one or more embodiments, the system undergoes special processing to skip syndrome calculation and/or inserting virtual zeros for the spare packages during reading data from and writing data to the packages. Virtual zeros mean that actual zeros are not stored in the storage devices such as NVM media card 126, but instead used in encoder and decoder during the operation. In an aspect, virtual zeros are written to the data part of the failed logical packages during encoding and decoding for syndrome calculation. In one or more aspects, the data recovered from a failed physical package is written to one of the provided spare physical packages. The improved system and method in one or more embodiments maintains and, in an embodiment, improves the ECC/RAID properties of the concatenated code CW x.

In one or more embodiments, the encoder/decoder pipeline in the NVM controller is modified as illustrated in FIGS. 8-12 to include a dynamic logical to physical mapper 820, that in an aspect includes the capability to remap the logical packages to physical packages. The updated mapping of the physical to logical packages preferably is stored in a conversion look-up L/P table 146 that is shared by the encoder 800 and decoder 1000. The conversion look-up L/P table 146 is preferably saved in NVM controller memory 142, NVM controller 140, and/or NVM memory packages on NVM card 126, although it can be stored in other alternative or additional locations. In addition, a number "L" of the "P" packages are provided as spare packages, meaning that no data is originally written to the "L" packages. Spare packages are included and provisioned in the system, preferably on the NVM media card 126, to be used in case any of the "utilized" physical packages fail. When "L" spares are included in the system, P total packages minus "L" spare packages (P-L) are available to store the user data and the parity, and L spares contain no data (e.g., zero's) until they are utilized. In one or more embodiments, the system also should account for the spare packages and in an aspect includes the capability to insert virtual zeros during encoding and decoding of the spare packages and/or skip encoding and decoding the spare packages. Furthermore, the system needs to take into account processing of the failed package and in an embodiment includes the capability to insert virtual zeros into the codeword in the position of the logically represented failed package. The insertion of virtual zeros for the spares and/or as part of the user data for the failed package will be explained in more detail below.

Figure 8:
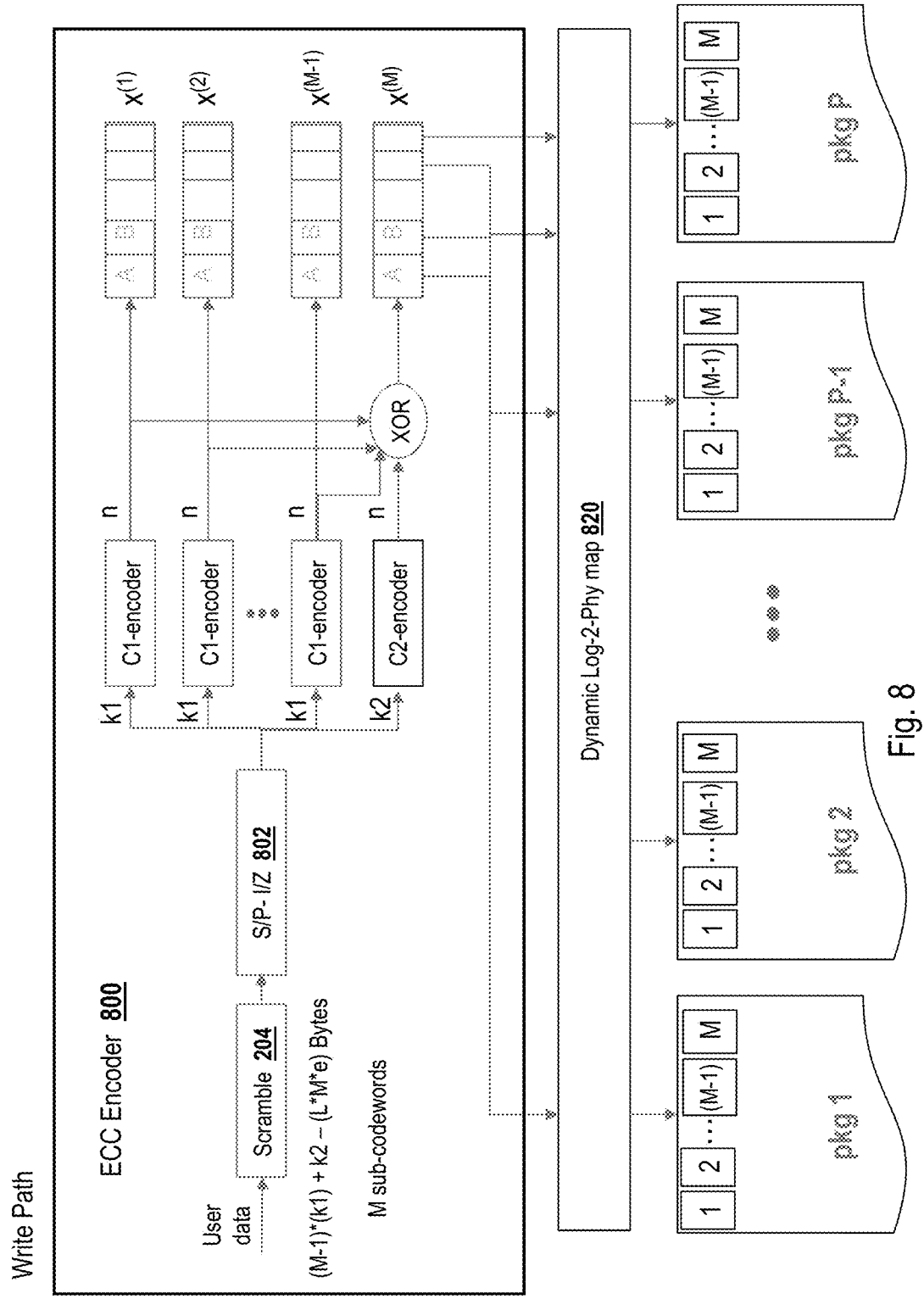
FIG. 8 depicts an exemplary encoder for encoding component codewords for a concatenated CW and interleaving with maximum equal spreading of data from the component codewords to packages in accordance with one embodiment of the present disclosure.

A write TOP as processed in the encoder pipeline 800 of FIG. 8 in the improved system before failure of a package will be explained. In the example of FIG. 8, the encoder 800 includes eleven C1 encoders and one C2 encoder where M=12 so twelve component or sub-codewords are used with a C1 code defined by an eight-bit symbol RS(n=216, $k_1$=179, $t_1$=13, e=9) and a C2 code defined by an eight-bit symbol RS(n=216, $k_2$=165, $t_2$=20, e=9). There are 24 total packages (P=24), of which 5 packages are spare packages (L=5) where no data is originally written to the "L" spare packages. As is shown, during a data writing TOP, data scrambler 204 receives $((M-1)\times k_1+k_2)-(L\times M\times e)$ bytes of user data for each concatenated CW x and scrambles the user data. In the example, the user data is 1594 bytes (2134−540=1594). The scrambled user data is then provided as an input to S/P-I/Z module 802. S/P-I/Z module 802 splits the scrambled user data and then routes designated portions of the split scrambled user data to respective inputs of the C1 encoders and the C2 encoder. In one or more embodiments, S/P-I/Z module 802 inserts virtual zeros as the data portion of the spare packages, which in this example where L=5 is five packages, preferably for the example system discussed the first five packages. Each of the C1 and C2 encoders receives a designated portion of the split scrambled user data, encodes the designated portion of the split scrambled user data (e.g., adds parity bits), and then provides 'n' bytes of encoded data at their respective outputs that correspond to respective component codewords $x^{(1)}, x^{(2)}, \ldots, x^{(M)}$ of the concatenated CW x.

A respective portion or chunk "c" of the encoded data in each component codeword $x^{(1)}, x^{(2)}, \ldots, x^{(M)}$ is assigned to each logical package preferably based on the maximum equal spreading property as discussed in conjunction with FIG. 5. For example, as shown in FIG. 8, first portions "A" of component codewords $x^{(1)}$-$x^{(12)}$ are assigned to logical package 1, second portions "B" of component codewords $x^{(1)}$-$x^{(12)}$ are assigned to logical package 2, third portions "C" of component codewords $x^{(1)}$-$x^{(12)}$ are assigned to logical package 3, and so on until all respective portions of the component codewords $x^{(1)}$-$x^{(M)}$ are assigned to a logical package, e.g., to P logical packages. Each logical package is mapped to a physical package as shown by Logical to Physical mapper 820 in FIG. 8. In an example, where no packages have failed, e.g., when user data is originally written to the physical packages and before any physical packages have failed, there is preferably a direct mapping of logical package to physical package, e.g., logical package 1 is mapped to physical package 1, logical package 2 is mapped to physical package 2, logical package 3 is mapped to physical package 3, etc. where logical package M is mapped to physical package M. In an embodiment, initially when data is written to the physical packages, and no physical packages have yet to fail, the logical package and physical package address is the same. While a direct mapping of logical to physical packages is utilized, other mappings of logical packages to physical packages are contemplated. The mapping of the logical to physical packages in one or more aspects can be kept in a conversion table, for example, conversion look-up L/P table 146, located in NVM controller memory 142, in NVM controller 140, and/or in NVM media card 126 (for example in NVM packages and/or non-volatile memory, e.g., DRAM). The conversion look-up L/P table 146 in an embodiment can be battery-backed DRAM and/or MRAM, and in an aspect includes a number of entries equal to the number of packages P.

Because the system has five (L=5) spares, not all 24 packages will have data written to them, and in an embodiment, the first five (5) physical packages, mapped to the first five (5) logical packages, will not contain data. That is, in an embodiment, data will originally be written to nineteen (19) physical packages 6-24, while spare packages 1-5 will not contain any data. As indicated above, to account for the spare packages, virtual zeros are inserted into the data portion of the spare packages, e.g., the first five packages, for encoding and decoding, e.g., for syndrome calculation. The virtual zeros are not physically written to the storage devices, i.e., the physical packages, but are inserted into position for syndrome calculation during encoding and decoding. Alternatively for case when first L packages contain spares, instead of inserting virtual zeros into the spare packages during decoding, the system can be configured and/or programmed to skip the syndrome calculation for the spare packages and perform syndrome calculation for the packages in use. That is the system could start syndrome calculation after the first five packages in the example system. As one or more physical packages fail, those failed packages will be replaced by spare physical packages 1-5. As will be seen, the system in an embodiment is configured so that logical packages 6-24 are always mapped to a physical package that contains data, while logical packages 1-5 will be mapped to the spare physical packages that do not contain data or the failed physical packages. While the examples disclosed refer to and contain five (5) spares, it can be appreciated that more or less spares can be provided, which at least in part is effected by the number P of packages and the codeword length. The maximum number of spare packages is P-X-1, where X is the number of packages that contain parity bytes. In this particular case, only 1 package would contain user data.

Figure 9:
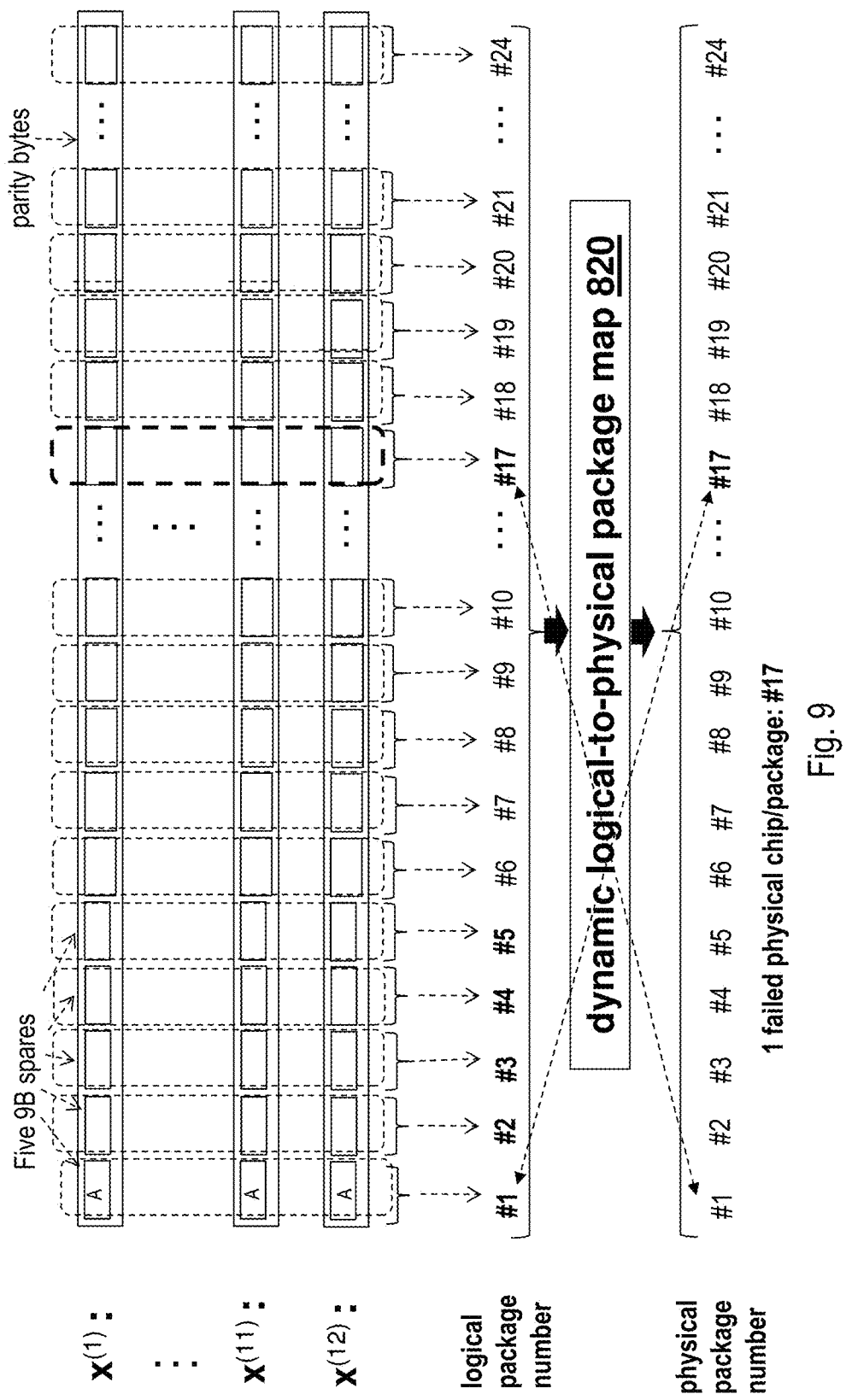
FIG. 9 depicts a remapping of a first failed physical package to a new, different logical package in an embodiment of an exemplary memory system.

The system and method will now be explained with reference to FIG. 9 where a physical package fails. For example, where physical package 17, originally mapped to logical package 17, fails, physical package 17 will be remapped to one of the available L spare packages, preferably the lowest order logical package that does not correspond to a physical package holding data. In an example embodiment, the first L logical packages can be reserved as spares corresponding to the first L physical packages. In the example of FIG. 9, L=5 so the first five physical packages originally are not written with data. The system can be configured with a different number "L" of spare packages, and the spare packages can be arranged differently, e.g., not be the first five physical packages. In the example of FIG. 9, physical package 17 which fails is originally mapped to logical package 17. When physical package 17 fails, physical package 17 is remapped to logical package 1, and logical package 17, which was mapped to physical package 17, is remapped to physical package 1. That is, the failed physical package 17 is remapped to logical package 1, and the spare physical package 1 is remapped to logical package 17, e.g., the logical and physical packages are swapped. In an embodiment, the conversion (look-up) L/P table 146 is updated with the new mappings, e.g. logical package 1 is mapped to physical package 17, and logical package 17 is mapped to physical package 1. The remapping of the logical package corresponding to the failed physical package can be done either before or after the decoding process. In so much as the erasure correction capability e of the system is 9 bytes, and the chunk or respective portion "c" is also 9 bytes, the system can recover from a package failure during the decoding process.

Figure 10:
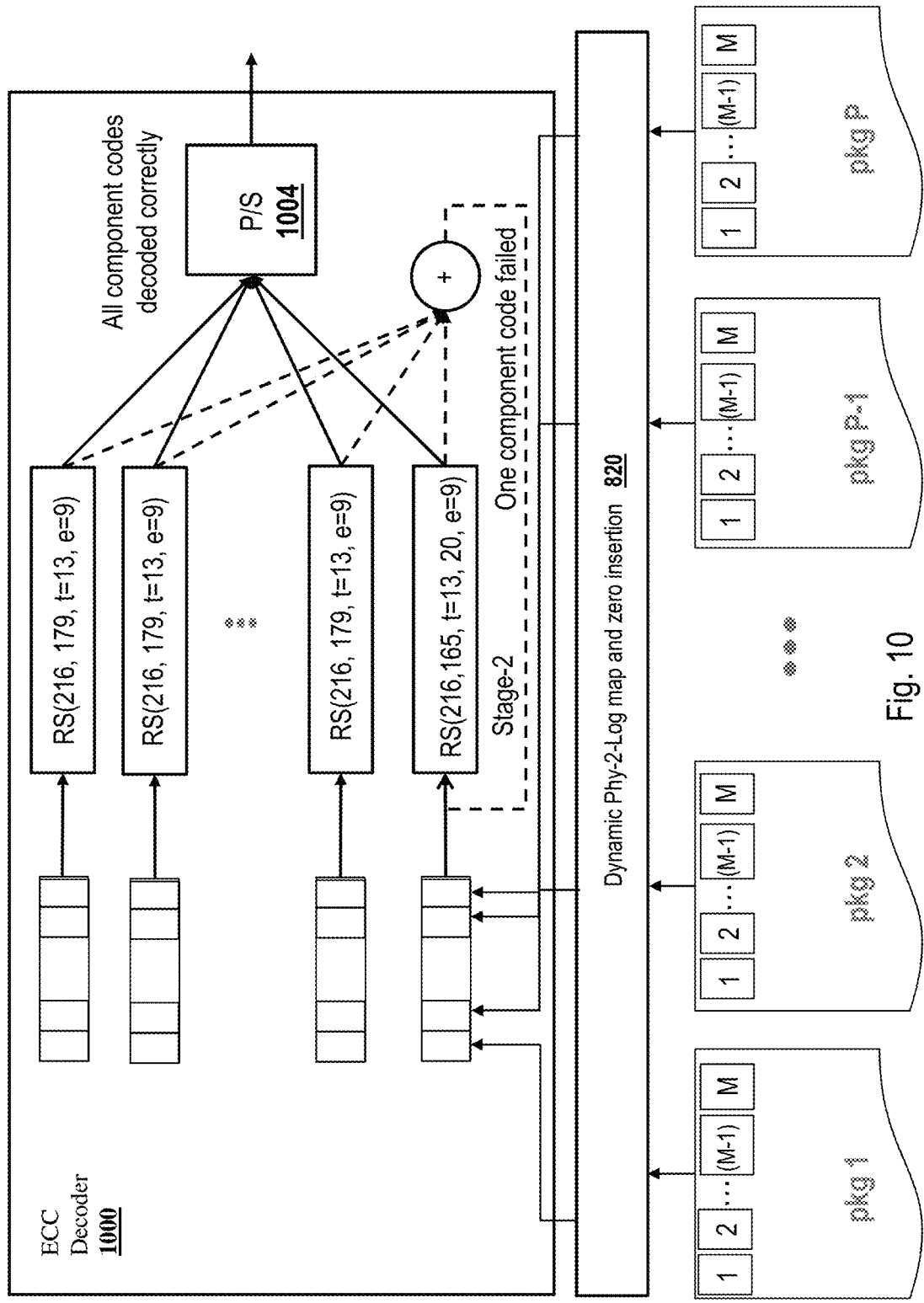
FIG. 10 depicts an exemplary decoder for decoding concatenated CWs in accordance with one embodiment of the present disclosure.
Figure 11:
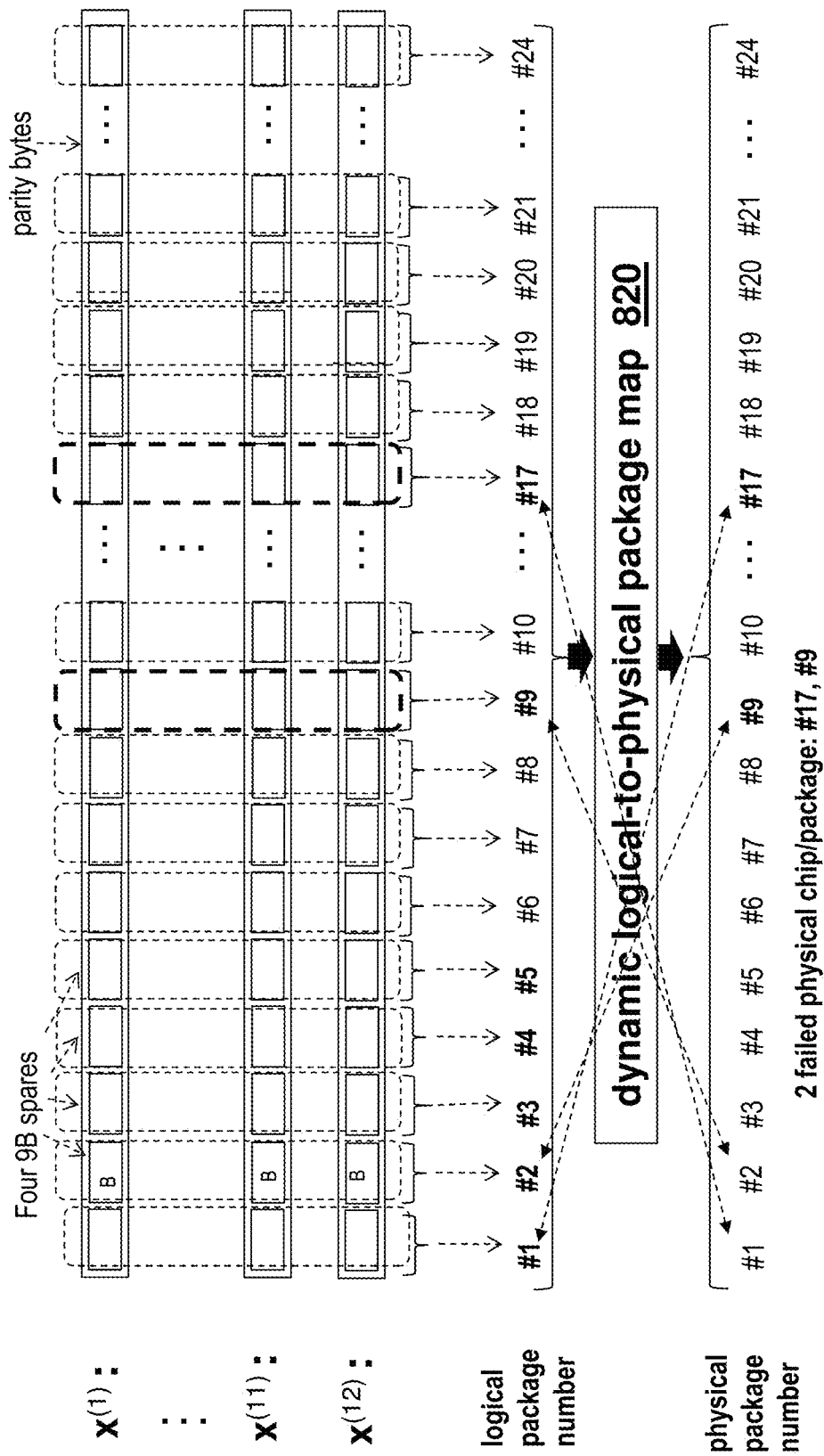
FIG. 11 depicts a remapping of a second failed physical package to a new, different logical package in an embodiment of an exemplary memory system.
Figure 12:
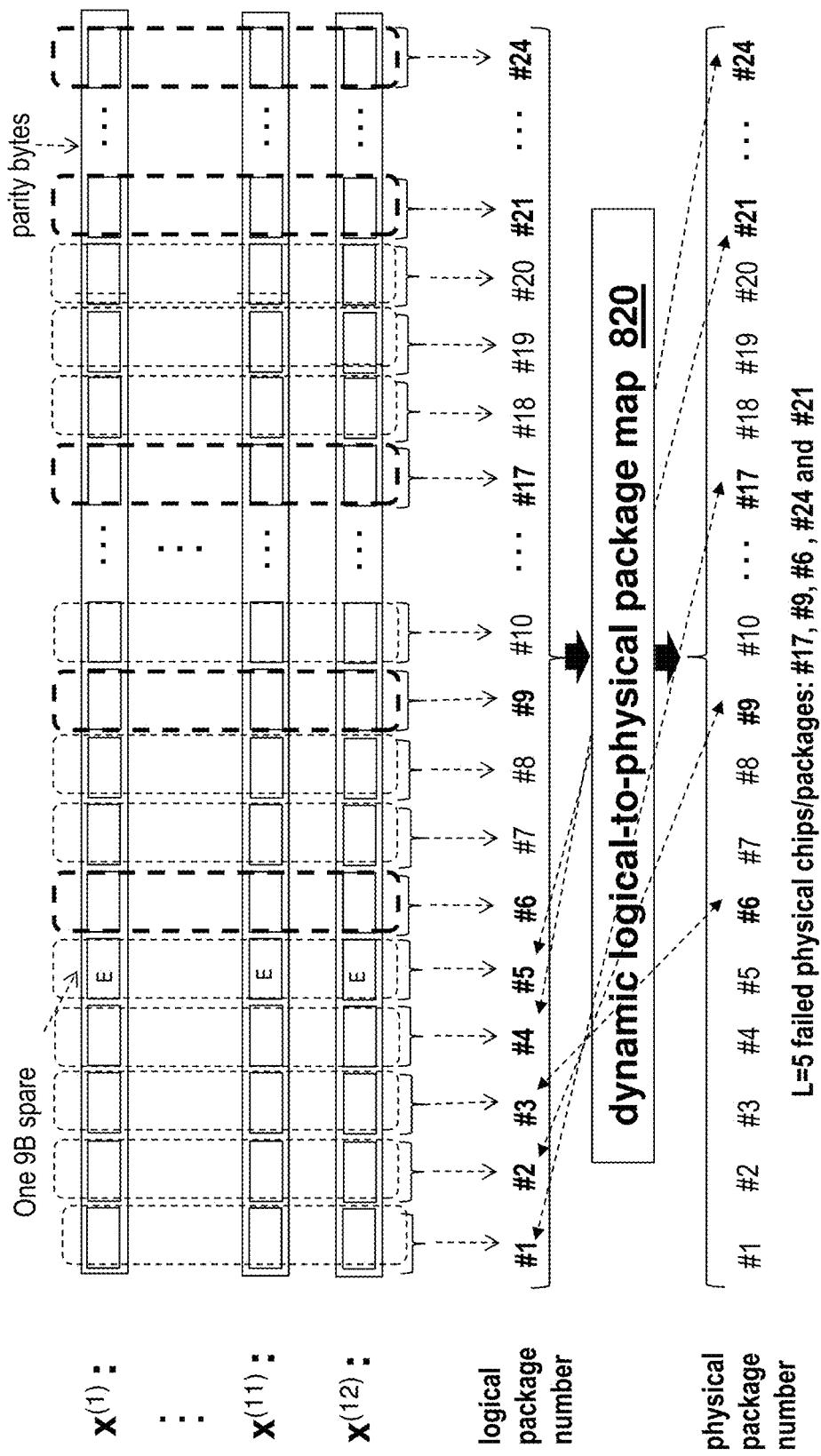
FIG. 12 depicts a remapping of a fifth failed physical package to a new, different logical package in an embodiment of an exemplary memory system.

In the embodiment where after remapping the failed physical package to one of the logical packages corresponding to one of the spare physical packages (spare logical package 1 which corresponded to and was mapped to spare physical package 1), the system undergoes erasure decoding and correction, the decoding process is performed as explained in connection with FIG. 10. After the system remaps the failed physical package to one of the available spare physical packages (e.g., by remapping the logical package of the failed physical package to one of the logical packages corresponding to the spare physical packages), e.g., in the example of FIG. 9 remapping failed physical package 17 to logical package 1, the data from logical packages 6-24 will be read, and sent through the ECC decoder 1000, where the data from the failed physical package 17 will be recovered. Since the data from the failed physical package 17 is assigned to logical package 1 this data will not be read during the decoding process. Instead virtual zeros are inserted for logical packages 1-5 in ECC decoder 1000.

More specifically, in one or more embodiments, the logically represented failed package has zeros inserted into the codeword before actual decoding. In this regard, the ECC decoder 1000 adds zeros to (e.g., writes zeros as) a respective portion of component codewords $x^{(1)}$ through $x^{(12)}$. Note in this example the zeros are written to portion or chunk "A" corresponding to logical package 1 (now mapped to failed physical package 17), which corresponds to portion or chunk "A" since the failed physical package has been remapped to logical package 1 which corresponds to respective portion or chunk "A". In this regard, logical package 1 has all zeros as user data. That is, the user data is encoded with zeros in the first portion A corresponding to logical package 1, which has been remapped to correspond to physical package 17. The logical package 17 to which physical package 1 is mapped will contain uninitialized data. The component codewords $x^{(1)}$-$x^{(12)}$ then undergo erasure decoding to recover the data originally stored in the failed physical package 17. The outputs of the decoders are combined by parallel to serial P/S module 1004 in FIG. 10 and the data from logical packages 6-24 are written the corresponding physical packages. Data will now be saved in physical packages 1, 6-16, and 18-24, which corresponds to logical packages 6-24, while spare physical packages 2-5 will remain available for failed physical packages. It should be noted that the virtual zeros are not written to the physical packages, but are logically inserted for the decoding (and encoding) process.

In the embodiment where remapping is performed after the decoding process the data from logical packages 6-24 that correspond to physical packages 6-24 are read and virtual zeros are inserted for logical packages 1-5 that correspond to physical packages 1-5. Virtual zeros inserted for logical packages 1-5 and the data from logical packages 6-24 are sent through the ECC decoder 1000, where the component codewords $x^{(1)}$-$x^{(12)}$ then undergo erasure decoding to recover the data originally stored in the failed physical package 17. The outputs of the decoders are combined by parallel to serial P/S module 1004 in FIG. 10 and the remapping of the logical package corresponding to the failed physical package is performed as in the example of FIG. 9. After the remapping, the logical packages 6-24 are written to the newly corresponding physical packages. Data will now be saved in physical packages 1, 6-16, and 18-24, which corresponds to logical packages 6-24, while spare physical packages 2-5 will remain available for failed physical packages.

In one or more embodiments, virtual zeros are utilized for encoding and decoding of the spare packages. In the case where the system and method accounts for the spare packages by utilizing virtual zeros as described above, the writing of virtual zeros for the logical package remapped to the failed physical package does not change. That is, the logical packages corresponding to the spare packages, e.g., logical packages 1-5 in the example system, use virtual zeros for the data portion when coding and decoding. However, accounting for the spares in a system can be handled in a number of different ways, and in those systems and techniques that do not use virtual zeros for encoding and decoding the spare packages, for example in those systems that skip the spares when decoding for erasures and errors, zeros should be inserted for the logical package corresponding to the failed package. In the example system, where there are five spares, and they are preferably the first five physical packages originally mapped to the first five logical packages, zeros preferably are written to the first five logical packages. That is virtual zeros are used in decoding the spare packages including when decoding a failed package that has been swapped out for a spare package. Using virtual zeros for all the spare packages may be a preferred implementation as the resources for processing of the failed package and insertion of virtual zeros is already utilized in the system.

Should the system undergo another package failure where the total package failures is less than L, then the system can still recover the data from an additional failed package and provision a spare physical package. For example in FIG. 11, a second physical package 9 fails, and in response to the second physical package failure, the system remaps physical package 9 to logical package 2, and remaps logical package 9 to physical package 2. In other words, the system switches the logical to physical package mapping for the failed physical package with one of the available spare packages. Since this is the second failure, and since physical package 1 now holds data, the failed physical package 9 is not remapped to logical package 1, but rather is remapped to one of the remaining spare packages, preferably the lowest order spare physical package, e.g., logical package 2. In one or more embodiments, the remapping of the logical and physical packages is updated and saved in the physical to logical conversion look-up table, e.g., conversion look-up L/P table 146.

In one or more embodiments the system undergoes erasure decoding before or after the remapping where the data from the packages are read, virtual zeros are inserted into the logical packages 1-5, and the component codewords (inserted with virtual zeros) are sent through decoder 1000 to recover the data originally stored in the failed package, e.g., physical package 9. In this example, virtual zeros are inserted into the respective portion of the component codewords $x^{(1)}$-$x^{(12)}$, e.g., the logical packages 1-5, and the component codewords are sent through the decoders. In one or more embodiments, the codewords are sent through all (12) C1 decoders and if the decoding fails, the failed codeword is sent through the C2 decoder. If the system is handling recovery from a failed package (erasure decoding), and there are no additional errors, C2 decoding will not be necessary.

The recovered data is written back to the physical packages, however, since physical package 9 has failed, the recovered data originally stored in the failed physical package 9 is not rewritten back to failed physical package 9, but rather the recovered data is assigned to logical package 9, to which physical package 9 was assigned, and as a result of the remapping of logical package 9 to physical package 2, the recovered data is rewritten back to physical package 2, one of the spare physical packages included on the NVM media card 126. In this manner, the data originally stored in the failed physical package 9 is recovered and written to one of the spare physical packages, e.g., physical package 2. Since two physical packages have now failed (physical packages 9 and 17), and failed physical package 17 has already been remapped to physical package 1, recovered data originally stored in the failed physical package 9 is written to one of the other spare physical packages, in this case physical package 2. Data will now be saved in physical packages 1-2, 6-8, 10-16, and 18-24, which corresponds to logical packages 6-24, while spare physical packages 3-5 will remain available for additional failed physical packages.

The process can continue until up to L packages have failed. In one or more embodiments, the packages preferably fail in succession, and multiple packages do not fail simultaneously in a system where the erasure correction capability e can not recover from more than one package failure at a time. Should the system undergo another package failure where the total package failures is less than or equal to L (# of failures is ≤L), then the system can still recover the data from an additional failed package. For example in FIG. 12, four physical packages (e.g., packages 6, 9, 17 and 24) have previously failed and their data has been recovered and written to spare respective physical packages 3, 2, 1, and 4, and a fifth physical package 21 fails, and in response to the fifth physical package failure, the system remaps physical package 21 to logical package 5, and remaps logical package 21 to physical package 5. In other words, the system switches the logical to physical package mapping for the failed physical package with the last available spare package (physical package 5). It should be noted that the remapping of the failed physical packages to spare logical packages 1-5 is shown but remapping of the respective spare physical packages 1-5 to their new, updated logical packages are not shown to keep FIG. 12 uncluttered. Since this is the fifth failure, and since physical packages 1-4 now hold data, the failed physical package 21 is not remapped to logical packages 1-4, but rather failed physical package 21 is remapped to the last remaining spare physical package, e.g., physical package 5. In one or more embodiments, the remapping of the logical and physical packages is updated and saved in the physical to logical conversion look-up table, e.g., conversion look-up L/P table 146.

In one or more embodiments the system undergoes erasure decoding where the data from the packages are read and sent through decoder 1000 to recover the data originally stored in the failed physical package 21. In this example, virtual zeros are written to the respective portion of the component codewords $x^{(1)}$-$x^{(12)}$, e.g., into logical packages 1-5 (including logical package 5 corresponding to failed physical package 21) and the component codewords are sent through the decoders.

The recovered data is written back to the physical packages, and in this example physical package 5. Since physical package 21 has failed, the recovered data originally stored in the failed physical package 21 is not rewritten back to failed physical package 21, but rather the recovered data is rewritten back to physical package 5, one of the spare physical packages included on the NVM media card 126. In this manner, the data originally stored in the failed physical package 21 is recovered and written to one of the spare physical packages. Since five physical packages have now failed (physical packages 6, 9, 17, 21 and 24), and failed physical packages 6, 9, 17, and 24 have already been remapped to physical packages 1-4, recovered data originally stored in the failed physical package 21 is written to the last spare physical package, in this case physical package 5. Data will now be saved in physical packages 1-5, 7-8, 10-16, 18-20, and 22-23 which corresponds to logical packages 6-24, while no spare physical packages remain available to hold data for a failed physical package.

Figure 13:
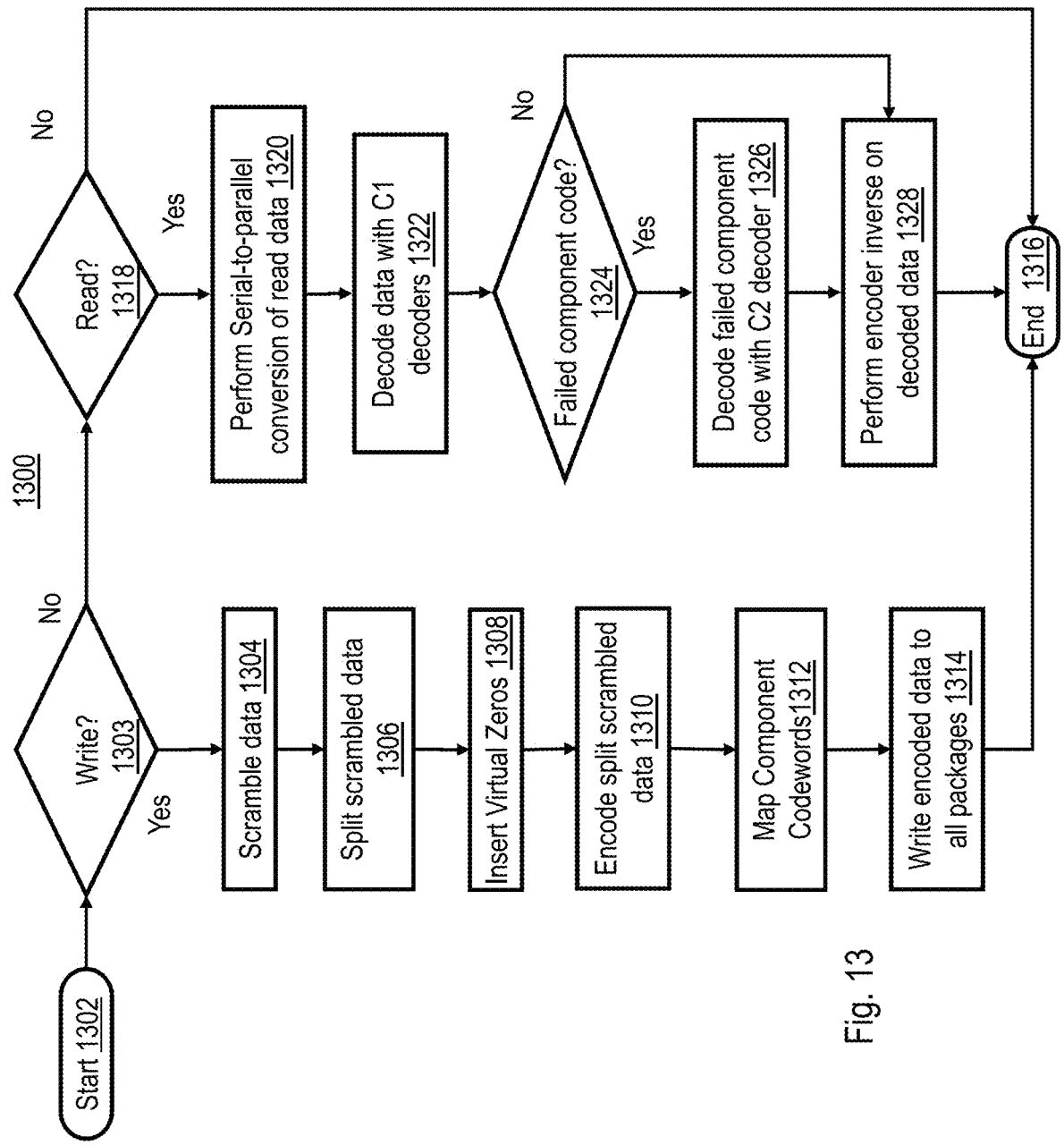
FIG. 13 is a high level logical flowchart of an exemplary data protection process for an NVM in accordance with one embodiment of the present disclosure.

With reference to FIG. 13, an exemplary process 1300 is illustrated that handles read/write IOPs directed to an NVM array, according to the improved system of the present disclosure. Process 1300 is initiated in block 1302 by, for example, an NVM controller 140, in response to receipt of a request from processor system 102 that is directed at an NVM array in an associated NVM system 150. Next, in decision block 1303, NVM controller 140 determines whether the received request is a write IOP. In response to the received request being a write IOP, control transfers from block 1303 to block 1304. In block 1304, NVM controller 140 scrambles (see scrambler 204 of FIG. 6) data associated with the write IOP. Then, in block 1306, NVM controller 140 splits (see splitter 602 of FIG. 6) the scrambled data into 'M' parts based on the implemented C1 and C2 codes. Next, in block 1308 virtual zeros are inserted (see S/P-I/Z module 802) into the respective portions of the M component codewords (e.g., into the logical blocks) corresponding to the spare packages. In this regard virtual zeros can be inserted into the locations that will correspond to all the spare packages. In the example system, virtual zeros are inserted into the data portion of codewords that will be assigned to logical packages 1-5. In an alternative, zeros are not inserted and the system skips or otherwise accounts for the spares during the syndrome calculation. In block 1310, NVM controller 140 encodes the split scrambled data using the implemented C1 and C2 encoders and forms M component codewords. In block 1312 the respective portions of the component codewords are assigned a logical package which is mapped to a physical package. In one or more embodiments the logical to physical mapping is saved in a conversion table. Then, in block 1314, NVM controller 140 writes the encoded data across all packages in the NVM array (see packages Pkg1-PkgP of FIG. 6) in such a way as to maximum equal spreading of each of the M component codewords across all P packages (see FIG. 8). Following block 1314 control transfers to block 1316, where process 1300 terminates.

In response to the received request not being a write TOP in block 1303 control transfers to decision block 1318. In block 1318 NVM controller 140 determines whether the received request is a read TOP. In response to the received request not being a read TOP control transfers from block 1318 to block 1316. In response to the received request being a read TOP in block 1318 control transfers to block 1320. In block 1320 NVM controller 140 performs serial-to-parallel (S/P) on read data associated with the read TOP to convert the read data into 'M' parts (see S/P converter 702 of FIG. 7). Next, in block 1322, NVM controller 140 decodes the read data with the 'M−1' C1 decoders and the C1 decoder of the C1/C2 decoder. Then, in decision block 1324, NVM controller 140 determines whether a single one of the component codewords failed decoding. In response to one of the component codewords failing decoding control transfers to block 1326. In block 1326, NVM controller 140 decodes the failed component codeword with the C2 decoder. Next, in block 1328, NVM controller 140 performs an encoder inverse operation (see encoder inverse module 704 of FIG. 7) on the decoded data (i.e., unscrambles the decoded data). Following block 1328 control transfers to block 1316. In response to none of the component codewords failing decoding in block 1324 control transfers directly to block 1328. It should be appreciated that if more than one package in an NVM array fails that an error message may be provided by NVM controller 140 to indicate that the read data is corrupted and cannot be corrected.

Figure 14:
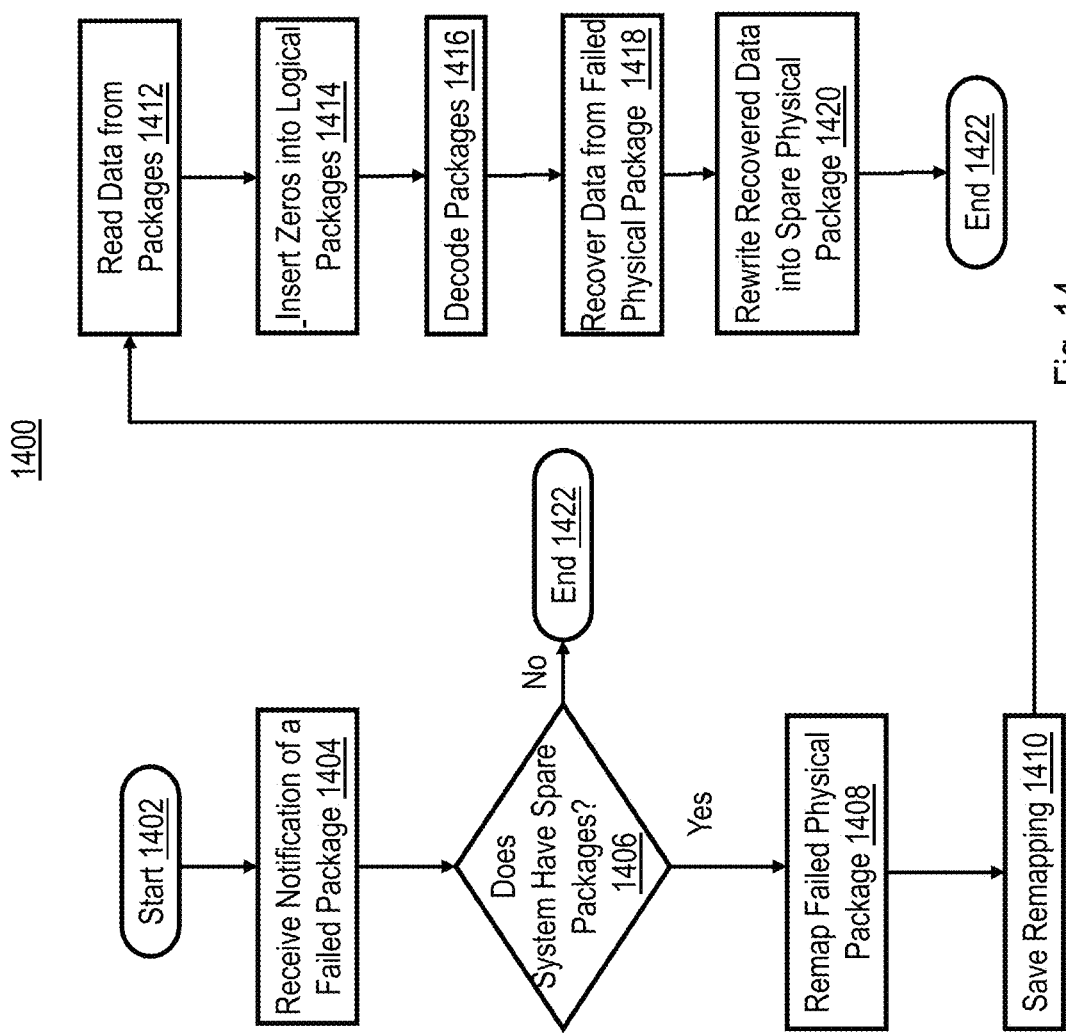
FIG. 14 is a high level logical flowchart of an exemplary process for recovering data from a failed physical package in an NVM in accordance with an embodiment of the present disclosure.

With reference to FIG. 14, an exemplary process 1400 is illustrated that handles a failed physical package in NVM array, according to the present disclosure. Process 1400 is initiated in block 1404 where the system is aware or is notified of a physical package failure. The system can be aware of a failed physical package in a number of different ways, including on system start-up, maintenance checks, and while reading data from the packages. At 1406 the system, for example, an NVM controller 140, determines whether or not the system has any spare physical packages. If the system does not have any spare packages (1406: No), then the system at 1422 can end the operation. It should be appreciated that if no spare packages are available, or if more packages in an NVM array fail than can be corrected (# of failed packages >e), that an error message may be provided by NVM controller 140 to indicate that the data is corrupted and cannot be corrected. In one or more embodiments, if there are no spare physical packages (1406: No), the system could recover the data and store to emergency back-up storage, or otherwise use spare bits from the packages, if the system is appropriately configured. If the system does have spare physical packages (1406: Yes), then the system at 1408 can remap the failed physical package to one of the spare physical packages. More specifically, at 1408, in one or more embodiments, the failed physical package is remapped to one of the spare logical packages that corresponds to one of the spare physical packages, preferably the lowest order physical package corresponding to a spare physical package, and the logical package that was mapped to the failed package is mapped to the spare physical package. In other words, the logical and physical mappings of the failed physical package and spare physical package are swapped.

At 1410 the remapping of the logical and physical packages are saved. The mapping in the look-up conversions table is updated and saved. Data is then read from the packages at 1412. In one or more embodiments, zeros are inserted at 1414 into the data corresponding to at least the failed physical package, and in an aspect into all the logical packages corresponding to the spare packages. The data read from the packages, including the failed package with virtual zeros inserted, and whether or not zeros were inserted into the data corresponding to the unused spare packages, is decoded at 1416 and the data from the failed physical package is recovered by erasure decoding at 1418. The recovered data from the failed physical package is rewritten into a spare physical package and saved at 1420. At this point the rewriting of the data to the spare package is complete and ends at 1422. It should be noted that the zeros are not written to the physical packages but are logically inserted for purposes of decoding (and encoding). After the system has recovered the data from the failed package and rewritten the data to a spare package, the system can proceed as normal attending to various memory accesses.

It should be appreciated that for the process of recovering data from failed packages the system and in particular the NVM media card should be provisioned with one or more spare physical packages, and that the system should be configured to handle erasures e that are as wide as the data held in the packages. In the examples above the packages had 9 bytes (symbols) of data (c=9) and the system could correct up to 9 erasures which corresponded to a failed physical package.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the present invention has been particularly shown as described with reference to one or more preferred embodiments, it will be understood by those skilled in the art that various changes in form and detail may be made therein without departing from the spirit and scope of the invention. For example, although aspects have been described with respect to a data storage system including a NVM controller that directs certain functions, it should be understood that present invention may alternatively be implemented as a program product including a storage device storing program code that can be processed by a processor to perform such functions or cause such functions to be performed. As employed herein, a "storage device" is specifically defined to include only statutory articles of manufacture and to exclude transmission media per se, transitory propagating signals per se, and forms of energy per se.

In addition, although embodiments have been described that include use of an NVM such as a phase change memory (PCM), it should be appreciated that embodiments of the present invention can also be used with other types of non-volatile random access memory (NVRAM) including, for example, flash memory, as well as traditional rotational hard drives (HDDs), shingled magnetic recording hard disk drives (SMR HDDs) and combinations thereof.

The figures described above and the written description of specific structures and functions below are not presented to limit the scope of what Applicants have invented or the scope of the appended claims. Rather, the figures and written description are provided to teach any person skilled in the art to make and use the inventions for which patent protection is sought. Those skilled in the art will appreciate that not all features of a commercial embodiment of the inventions are described or shown for the sake of clarity and understanding. Persons of skill in this art will also appreciate that the development of an actual commercial embodiment incorporating aspects of the present inventions will require numerous implementation-specific decisions to achieve the developer's ultimate goal for the commercial embodiment. Such implementation-specific decisions may include, and likely are not limited to, compliance with system-related, business-related, government-related and other constraints, which may vary by specific implementation, location and from time to time. While a developer's efforts might be complex and time-consuming in an absolute sense, such efforts would be, nevertheless, a routine undertaking for those of skill in this art having benefit of this disclosure. It must be understood that the inventions disclosed and taught herein are susceptible to numerous and various modifications and alternative forms. Lastly, the use of a singular term, such as, but not limited to, "a" is not intended as limiting of the number of items.

What is claimed is:

1. A method of protecting data in a data storage system, comprising:
   receiving, by a controller, the data for storage in a non-volatile memory (NVM) array of the data storage system having a total number P of physical packages that includes a number L of spare physical packages, wherein each one of the P physical packages is mapped to one of a plurality of logical packages;
   storing, by the controller, a respective portion of component codewords on the number (P-L) physical packages of the NVM array;
   in response to one of the (P-L) physical packages failing, dynamically remapping the failed physical package to one of the logical packages mapped to one of the available spare physical packages;
   reading at least the failed physical package and logically inserting virtual zeros into the respective portion of the component codewords corresponding to the failed physical package;
   performing erasure decoding to recover the data from the failed package; and
   rewriting the recovered data from the failed package into the one of the available spare physical packages.

2. The method of claim 1, further comprising remapping the failed physical package to a lowest order spare physical package.

3. The method of claim 1, further comprising switching the logical package mappings of both the failed physical package and the one of the available spare physical packages.

4. The method of claim 1, further comprising, during encoding of the L spare physical packages, inserting virtual zeros into a data portion of the logical packages corresponding to the L spare physical packages.

5. The method of claim 1, further comprising:
   after remapping, reading the component codewords from the P physical packages;
   for purposes of decoding the component codewords, inserting virtual zeros into the logical package that was remapped to the failed physical package; and
   sending the component codewords to decoders to recover the data from the failed physical package.

6. The method of claim 1, further comprising:
   after remapping, reading the component codewords from the P physical packages; and
   for purposes of decoding the component codewords, inserting virtual zeros into all the logical packages that are mapped to the spare physical packages.

7. The method of claim 1, further comprising determining, in response to the physical package failure, whether the system has any available spare physical packages.

8. The method of claim 7, further comprising updating, in response to the remapping of the failed physical package to one of the logical packages mapped to one of the L spare physical packages, a conversion look-up table containing mappings of the logical packages to the physical packages.

9. A data storage system, comprising:
   a non-volatile memory (NVM) array; and
   a controller coupled to the NVM array, wherein the controller is configured to:
   receive data for storage in the NVM array having a total number P of physical packages that includes a number L of spare physical packages, wherein each one of the P physical packages is mapped to one of a plurality of logical packages;
   store a respective portion of each of a component codeword on a number (P-L) of physical packages of the NVM array;
   in response to one of the (P-L) physical packages failing, dynamically remap the failed physical package to one of the logical packages mapped to one of the available spare physical packages;
   read the physical packages that are not spare physical packages and logically insert virtual zeros into the respective portion of the component codewords corresponding to the failed physical package and the spare physical packages;
   perform erasure decoding to recover the data originally stored in the failed package; and
   rewrite the recovered data originally stored in the failed package into the one of the available spare physical packages.

10. The data storage system of claim 9, wherein the system is configured to remap the failed physical package to a lowest order spare physical package.

11. The data storage system of claim 9, wherein the system is configured to switch the logical package mappings of both the failed physical package and the spare physical package.

12. The data storage system of claim 9, wherein the controller is further configured to, during the encoding of the spare physical packages, insert virtual zeros into a data portion of the logical packages corresponding to the spare physical packages.

13. The data storage system of claim 9, wherein the system is further configured to:
   read the component codewords from the logical packages that don't correspond to the spare physical packages;
   for purposes of decoding the component codewords, insert virtual zeros into the logical packages corresponding to the spare packages; and
   send the component codewords to decoders to recover the data originally stored in the failed physical package.

14. The data storage system of claim 9, wherein the controller is further configured to:
   read component codewords from the physical packages that are mapped to logical packages that are not the spare physical packages; and
   for purposes of decoding the component codewords, insert virtual zeros into all the logical packages that are mapped to the spare physical packages.

15. The data storage system of claim 9, wherein the controller is further configured to:
   determine, in response to the physical package failure, whether the system has any available spare physical packages; and
   update, in response to the remapping of the failed physical package to one of the logical packages mapped to one of the available spare physical packages, a conversion look-up table containing mappings of the logical packages to the physical packages.

16. The data storage system of claim 9, wherein the system has 24 packages including 5 spare packages, wherein the respective portion is less than or equal to the number of symbol erasures the system can recover.

17. A computer program product, the computer program product comprising a computer readable storage medium having program instructions embodied therein, the program instructions executable by a controller, to cause the controller to:
- receive data for storage in a non-volatile memory (NVM) array having a total number P of physical packages that includes a number L of spare physical packages, wherein each one of the P physical packages is mapped to one of a plurality of logical packages;
- store a respective portion of component codewords on a number (P-L) physical packages of the NVM array;
- dynamically remap, in response to one of the (P-L) physical packages failing, the failed physical package to one of the logical packages mapped to one of the L spare physical packages;
- read the physical packages that are not spare physical packages and logically insert virtual zeros into the respective portion of the component codewords corresponding to the failed physical package and the spare physical packages;
- perform erasure decoding to recover the data originally stored in the failed physical package; and
- rewrite the recovered data originally stored in the failed physical package into the one of the available spare physical packages.

18. The program product of claim 17, further comprising program instructions to cause the controller to switch the logical package mappings of both the failed physical package and the spare physical package.

19. The program product of claim 17, further comprising program instructions to cause the controller system to:
- read the component codewords from the physical packages that are not the spare physical packages;
- for purposes of decoding the component codewords, insert virtual zeros into the logical packages corresponding to the spare packages; and
- send the component codewords to decoders to recover the data from the failed physical package.

20. The program product of claim 17, further comprising program instructions to cause the controller to:
- during encoding of the L spare packages, insert zeros into a data portion of the logical packages corresponding to the L spare physical packages;
- determine, in response to the package failure, whether the system has any available spare physical packages; and
- update, in response to the remapping of the failed physical package to one of the logical packages mapped to one of the L spare physical packages, a conversion look-up table containing mappings of the logical packages to the physical packages.

* * * * *